(12) United States Patent
Uzoh et al.

(10) Patent No.: US 11,296,053 B2
(45) Date of Patent: Apr. 5, 2022

(54) DIRECT BONDED STACK STRUCTURES FOR INCREASED RELIABILITY AND IMPROVED YIELD IN MICROELECTRONICS

(71) Applicant: INVENSAS BONDING TECHNOLOGIES, INC., San Jose, CA (US)

(72) Inventors: Cyprian Emeka Uzoh, San Jose, CA (US); Rajesh Katkar, Milpitas, CA (US); Thomas Workman, San Jose, CA (US); Guilian Gao, San Jose, CA (US); Gaius Gillman Fountain, Jr., Youngsville, NC (US); Laura Wills Mirkarimi, Sunol, CA (US); Belgacem Haba, Saratoga, CA (US); Gabriel Z. Guevara, Gilroy, CA (US); Joy Watanabe, Campbell, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/911,360

(22) Filed: Jun. 24, 2020

(65) Prior Publication Data

US 2020/0411483 A1 Dec. 31, 2020

Related U.S. Application Data

(60) Provisional application No. 62/866,965, filed on Jun. 26, 2019.

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/561* (2013.01); *H01L 23/3121* (2013.01);
(Continued)

(58) Field of Classification Search
CPC ............. H01L 25/0657; H01L 23/3121; H01L 21/561; H01L 24/97; H01L 2224/0401; H01L 2924/3511; H01L 2924/35121
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2002-353416 A 6/2002
JP 2013-33786 A 2/2013
(Continued)

OTHER PUBLICATIONS

PCT SR/WO for PCT/US2020/039632; dated Oct. 12, 2020, 3 pages.
(Continued)

*Primary Examiner* — Nu A Vu
(74) *Attorney, Agent, or Firm* — Lee & Hayes, P.C.

(57) ABSTRACT

Direct bonded stack structures for increased reliability and improved yields in microelectronics are provided. Structural features and stack configurations are provided for memory modules and 3DICs to reduce defects in vertically stacked dies. Example processes alleviate warpage stresses between a thicker top die and direct bonded dies beneath it, for example. An etched surface on the top die may relieve warpage stresses. An example stack may include a compliant layer between dies. Another stack configuration replaces the top die with a layer of molding material to circumvent
(Continued)

warpage stresses. An array of cavities on a bonding surface can alleviate stress forces. One or more stress balancing layers may also be created on a side of the top die or between other dies to alleviate or counter warpage. Rounding of edges can prevent stresses and pressure forces from being destructively transmitted through die and substrate layers. These measures may be applied together or in combinations in a single package.

18 Claims, 23 Drawing Sheets

(51) Int. Cl.
    *H01L 23/31*      (2006.01)
    *H01L 21/56*      (2006.01)

(52) U.S. Cl.
    CPC ...... *H01L 24/97* (2013.01); *H01L 2224/0401* (2013.01); *H01L 2924/3511* (2013.01); *H01L 2924/35121* (2013.01)

(58) Field of Classification Search
    USPC .......................................................... 257/678
    See application file for complete search history.

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,262,492 B2 * | 8/2007 | Pieda ............... | H01L 23/49833 257/678 |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 9,059,010 B2 * | 6/2015 | Yoshida ............... | H01L 25/0657 |
| 9,093,350 B2 | 7/2015 | Endo et al. | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,343,433 B2 * | 5/2016 | Lee ..................... | H01L 21/563 |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,865,567 B1 * | 1/2018 | Chaware ............. | H01L 25/0655 |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,026,605 B2 | 7/2018 | Doub et al. | |
| 10,075,657 B2 | 9/2018 | Fahim et al. | |
| 10,269,756 B2 | 4/2019 | Uzoh | |
| 10,276,619 B2 | 4/2019 | Kao et al. | |
| 10,770,430 B1 * | 9/2020 | Kim ...................... | H01L 25/18 |
| 2002/0003307 A1 | 1/2002 | Suga | |
| 2004/0084414 A1 | 5/2004 | Sakai et al. | |
| 2004/0140546 A1 | 7/2004 | Lee et al. | |
| 2006/0057945 A1 | 3/2006 | Hsu et al. | |
| 2007/0111386 A1 | 5/2007 | Kim et al. | |
| 2012/0025396 A1 | 2/2012 | Liao et al. | |
| 2014/0175655 A1 | 6/2014 | Chen et al. | |
| 2015/0064498 A1 | 3/2015 | Tong | |
| 2016/0343682 A1 | 11/2016 | Kawasaki | |
| 2017/0200659 A1 * | 7/2017 | Gaynes ................ | H01L 24/32 |
| 2018/0068958 A1 | 3/2018 | Cho et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0103409 A1 | 4/2019 | Ku et al. | |
| 2019/0115277 A1 | 4/2019 | Yu et al. | |
| 2019/0131277 A1 | 5/2019 | Yang et al. | |

FOREIGN PATENT DOCUMENTS

| | | |
|---|---|---|
| JP | 2018-160519 A | 10/2018 |
| WO | 2005-043584 A2 | 5/2005 |
| WO | 2009005898 | 1/2009 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
Moriceau, H. et al., "Overview of Recent Direct Wafer Bonding Advances and Applications", Advances in Natural Sciences-Nanoscience and Nanotechnology, 2010, 12 pages.
Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.
Plobi et al., "Wafer Direct Bonding: Tailoring Adhesion Between Brittle Materials," Materials Science and Engineering Review Journal, 1999, 88 pages.
Suga et al., "Bump-less Interconnect for Next Generation System Packaging," IEEE (2001) and ECTC 2001, 6 pages.
WO2020028080 Search Report and Written Opinion, dated Jul. 2019, 9 pages.

\* cited by examiner

MOLDED BONDED DIES WITH LATERAL DIE SUPPORT STRUCTURE

BONDED MULTIPLE THIN DIES

MULTIPLE DIRECT-BONDED THIN DIES
REINFORCED WITH UNDERFILL
AS LATERAL SUPPORT

BONDING OF MULTIPLE DIES ONTO
LATERALLY REINFORCED STACK

MOLDING AROUND BONDED DIE STACK

ASSEMBLY OF DIRECT HYBRID BONDED DIE STACKS AND PROCESSOR ON A SUBSTRATE

DIRECT BONDED STACK STRUCTURES FOR INCREASED RELIABILITY AND IMPROVED YIELD IN MICROELECTRONICS

RELATED APPLICATIONS

This nonprovisional patent application claims the benefit of priority to U.S. Provisional Patent Application No. 62/866,965 to Uzoh et al., filed Jun. 26, 2019 and incorporated by reference herein in its entirety.

BACKGROUND

Stacks of integrated circuit microchips ("dies") bonded together during fabrication of conventional 3DIC microelectronic packages, such as high bandwidth memory modules (HBM, HBM2, HBM3), are vulnerable to certain types of defects by virtue of the vertical stacking, and these defects affect the overall production yield. In the case of the HBM2 modules, for example, memory specifications may dictate some physical dimensions of the modules to be constructed, such as a 700 μm height requirement.

As shown in FIG. 1, the high bandwidth of an example conventional HBM2 memory module 100 is achieved by bonding multiple memory dies 102 together in a vertical stack 103 on a substrate 104. Each individual die 102 may have a certain vertical thickness, such as 55 μm. At the top of the vertical stack, a top die 106 to be added is often made thicker than the other dies 102 in order to reach the 700 μm (or other) specification for height. For example, the top die 106 may be 90-400 μm in thickness, compared to 55 μm in thickness for each of the dies 102 below the top die 106. In some cases, this top die 106 may be a dummy or spacer die. The module 100 may be filled out and completed with a side filler 108, underfill, or molding material.

The thicker top die 106 may cause structural problems for the dies 102 stacked beneath it during fabrication, decreasing the average reliability and overall production yield. For various reasons, the multiple thin dies 102 forming the vertical memory stack 103 under the top die 106 may assume a negative warpage, with the warp facing concave side down 110. The thicker top die 106 often ends up with a positive warpage, facing concave-up 112. When the concave-up top die 106 is pressed into the concave-down stack of dies 102 beneath it during bonding to the vertical stack 103, destructive defects such as cracking 114 of the direct bonded dies 102, delamination 116 of the bond between dies, or cracking and chipping 118 of the substrate 104 underlying the vertical stack at points of increased pressure may occur in a certain number of instances, decreasing overall yield. The cracking 114 of thin dies 102 may occur near the edges of the dies 102, when there is a slight difference in footprint sizes between the dies 102, creating small overhangs where pressure forces can concentrate.

SUMMARY

Direct bonded stack structures for increased reliability and improved yields in microelectronics are provided. Structural features and stack configurations are provided for memory modules and 3DICs to reduce both severe and minor defects in vertically stacked dies. Example processes alleviate warpage stresses between a thicker top die and direct bonded dies beneath it, for example. In one technique, an etched surface on the top die may relieve warpage stresses. In another technique, an example stack may include a compliant layer between the top die and dies beneath it. Another example stack configuration replaces the top die with a layer of molding material to circumvent warpage stresses. An array of cavities on the bonding surface of the top die can also alleviate stress forces. One or more stress balancing layers may also be created on the topside or backside of the top die, or between thin dies as another way to relieve stack stresses and warpage. Rounding of edges can prevent stresses and pressure forces from being destructively transmitted through die and substrate layers. These various techniques and structures are not mutually exclusive, but may be used together or in various combinations in the package.

This summary is not intended to identify key or essential features of the claimed subject matter, nor is it intended to be used as an aid in limiting the scope of the claimed subject matter.

DETAILED DESCRIPTION

Overview

This disclosure describes direct bonded stack structures for increased reliability and improved yields in microelectronics. Structural features and stack configurations are provided for memory modules, stacked passive elements, interposers, and 3DICs to reduce both severe and minor defects in vertically stacked dies. Example processes and structures alleviate stresses, such as warpage stresses, between a thicker top die and direct bonded dies beneath it or a thinner top die directly bonded to a thicker die beneath, for example.

In an implementation, a surface that has been ground and etched on the top die may relieve stresses, such as warpage stresses, of the stack of dies. In the same or another implementation, the example stack may include a compliant layer between the top die and dies beneath it to relieve warpage stresses. In an implementation, another stack configuration replaces the top die with a layer of molding material to circumvent warpage stresses. In another implementation, an array of cavities on the bonding surface of the top die or elsewhere can alleviate stress forces. Yet again, a stress balancing layer may also be created on the topside or backside of the top die to relieve warpage stresses of the stack, or one or more stress balancing layers can intervene between other dies in a stack of dies. In another example technique and related structure, right-angle corners of some dies in a stack are rounded to prevent concentration of pressing forces at square corners of dies during stack fabrication, and to prevent transmission of those concentrated forces to relatively fragile dies or substrate layer below or above, cracking and chipping them.

Example Processes and Systems

Example processes fabricate stack structures with structural features and configurations to reduce severe and minor defects that can occur in vertical stacks of direct bonded dies. Memory modules include, but are not limited to, 3DS®, HMC hybrid memory cube, HBM, HBM2 and HBM3, which are described below as representative examples, but the described technology can be applied to any microelectronics package with vertically stacked dies, especially dies that are direct bonded together, and the structures and techniques described herein are not limited to memory modules.

It should be noted that the embodiments described below can in some cases be combined together in a single embodiment that includes the features of each embodiment described below. The embodiments described below are not intended to be mutually exclusive, but may be combined together, when possible.

Figure 1:
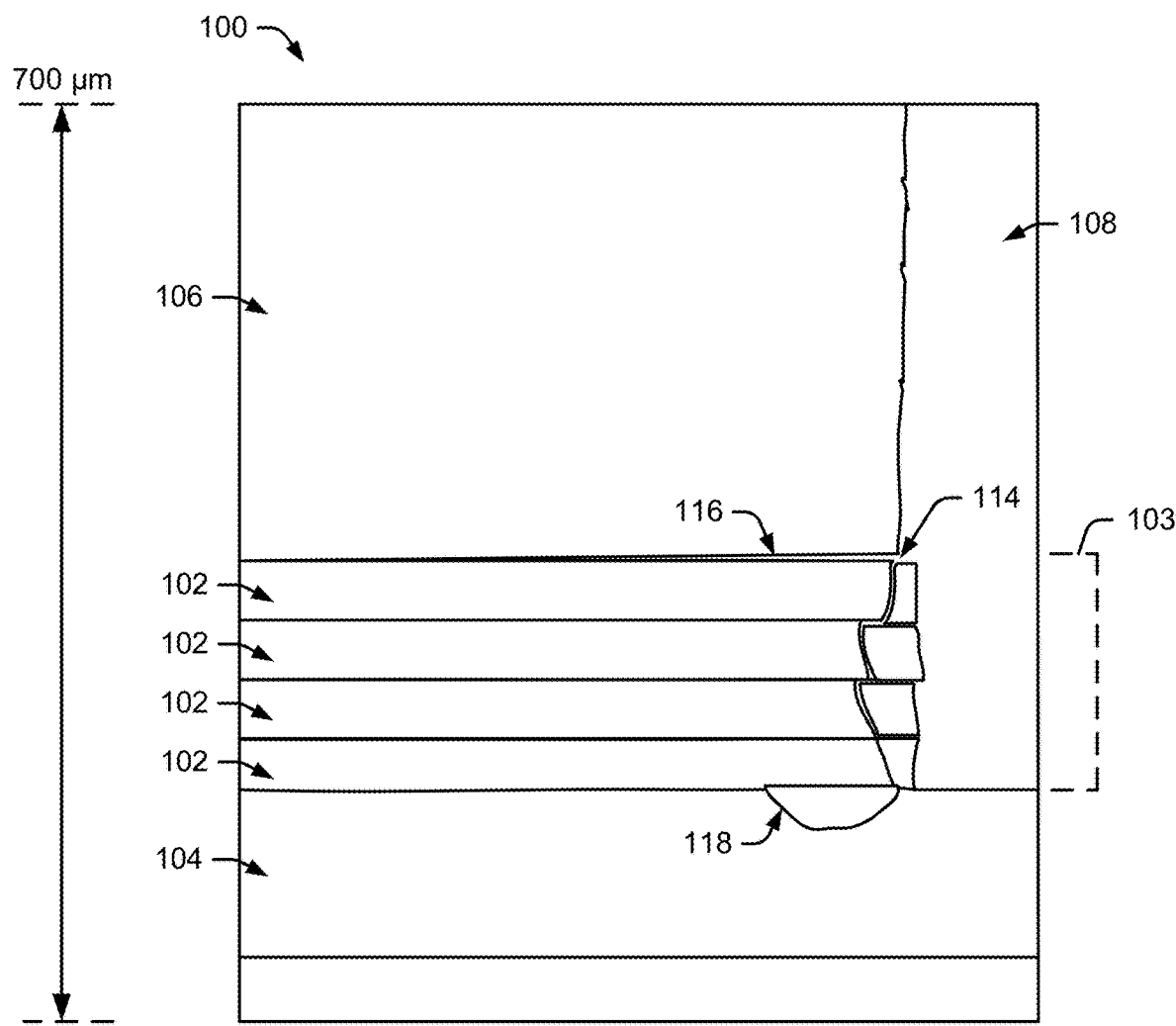
FIG. 1 is a diagram of a conventional prior art vertical die stack with structural problems introduced by various stresses and die warpage, including delamination of bonds, cracking, and chipping resulting in unreliability and decreased production yield.
Figure 1:
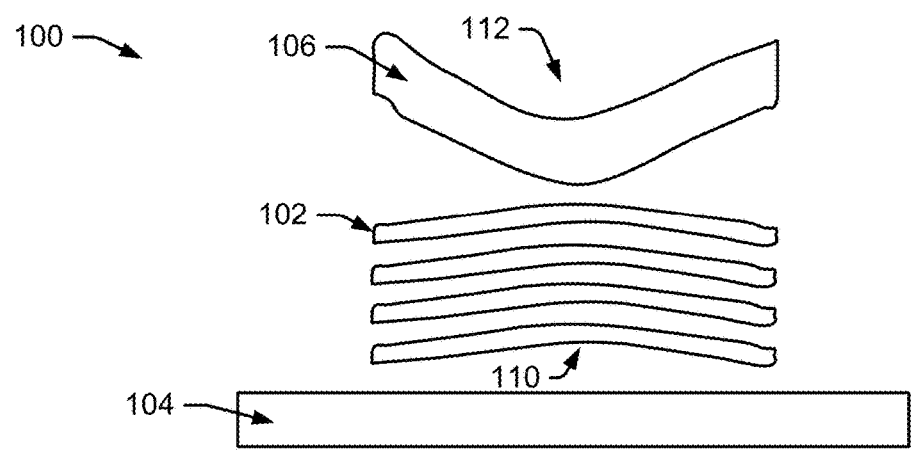
Figure 2:
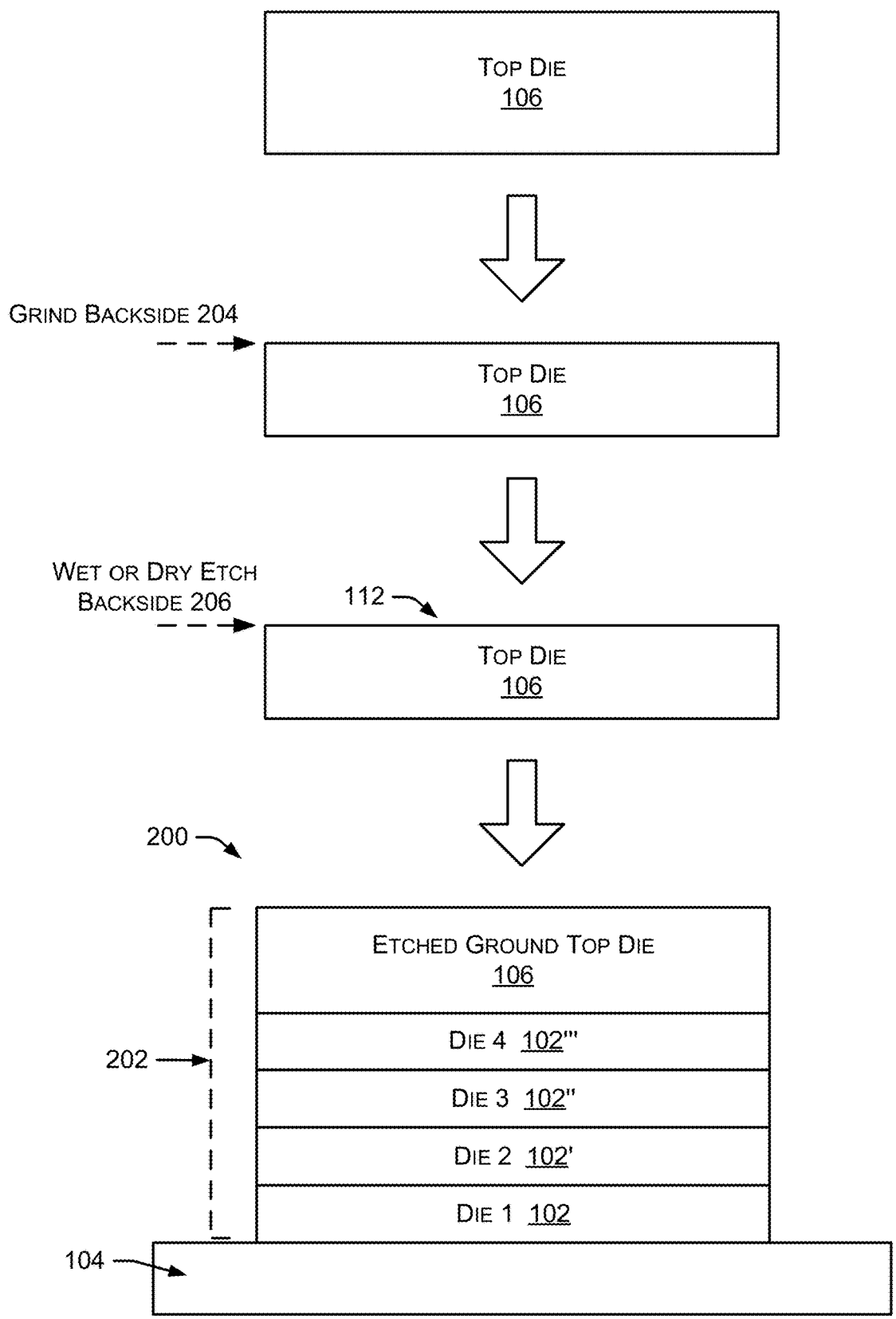
FIG. 2 is a diagram of an example module with a grind/etch feature for alleviating a warpage stresses in a vertical stack of dies.

FIG. 2 shows an example memory module 200 with a die stack 202 that includes a feature for alleviating a warpage stress in the vertical stack 202. The top die 106 of the stack 202 has a surface that is treated by grinding 204 and then either wet etching 206 or dry etching 206 to relieve a warpage 112 or an internal stress of the top die 106, thus decreasing or eliminating its concavity 112 in some cases. The etching 206 relieves pent up stress from the grinding operation 204. This in turn helps to relieve defects resulting from stress forces that can occur between the top die 106 and the dies 102 beneath it. As above, substrate 104 may be an organic or inorganic structure, such as a circuit board, package substrate, die, wafer, carrier etc, which may be electrically coupled to the stack 202, including coupling at least in part through direct and/or hybrid bonding, eutectic bonding, etc.

Figure 3:
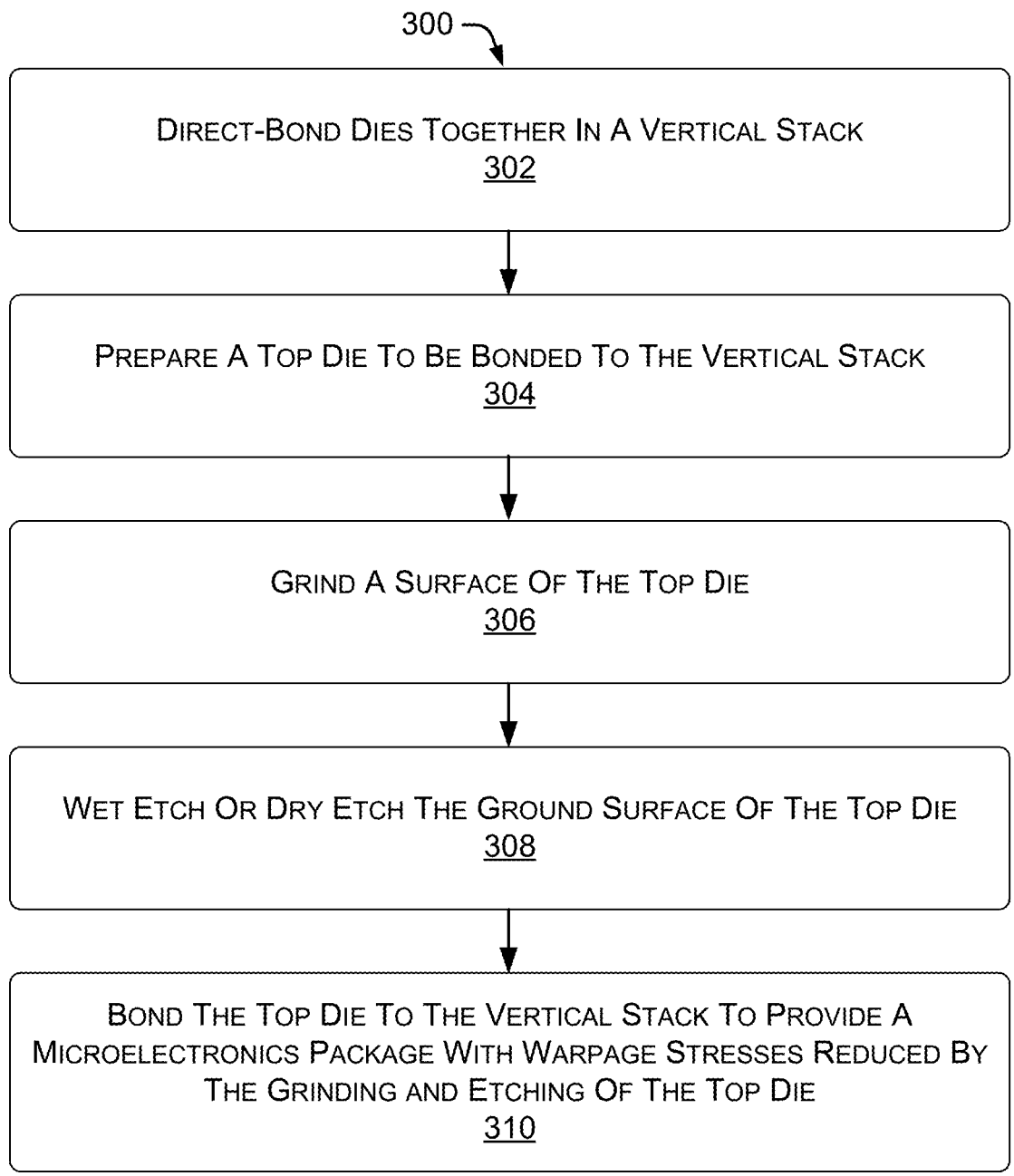
FIG. 3 is a flow diagram of an example process for making the structure of FIG. 2.

FIG. 3 shows an example process 300 for making the structure 200 of FIG. 2. In FIG. 3, operations of the example process are shown in individual blocks.

At block 302, the example process includes direct bonding dies 102 together to make part of the vertical stack 202.

At block 304, the top die 106 is prepared for bonding to the top of the other dies 102 to form vertical stack 202.

At block 306, the backside of the top die 106 is ground.

At block 308, the backside of the top die 106 is then wet etched 206 or dry etched for stress relief.

At block 310, the top die 106 is then bonded to the dies below 102, to produce a microelectronics package 200 of vertically stacked dies 102 & 106 with reduced internal stress and increased reliability, thereby alleviating a warpage stress between the top die 106 and the dies 102 in the vertical stack beneath the top die 106.

Figure 4:
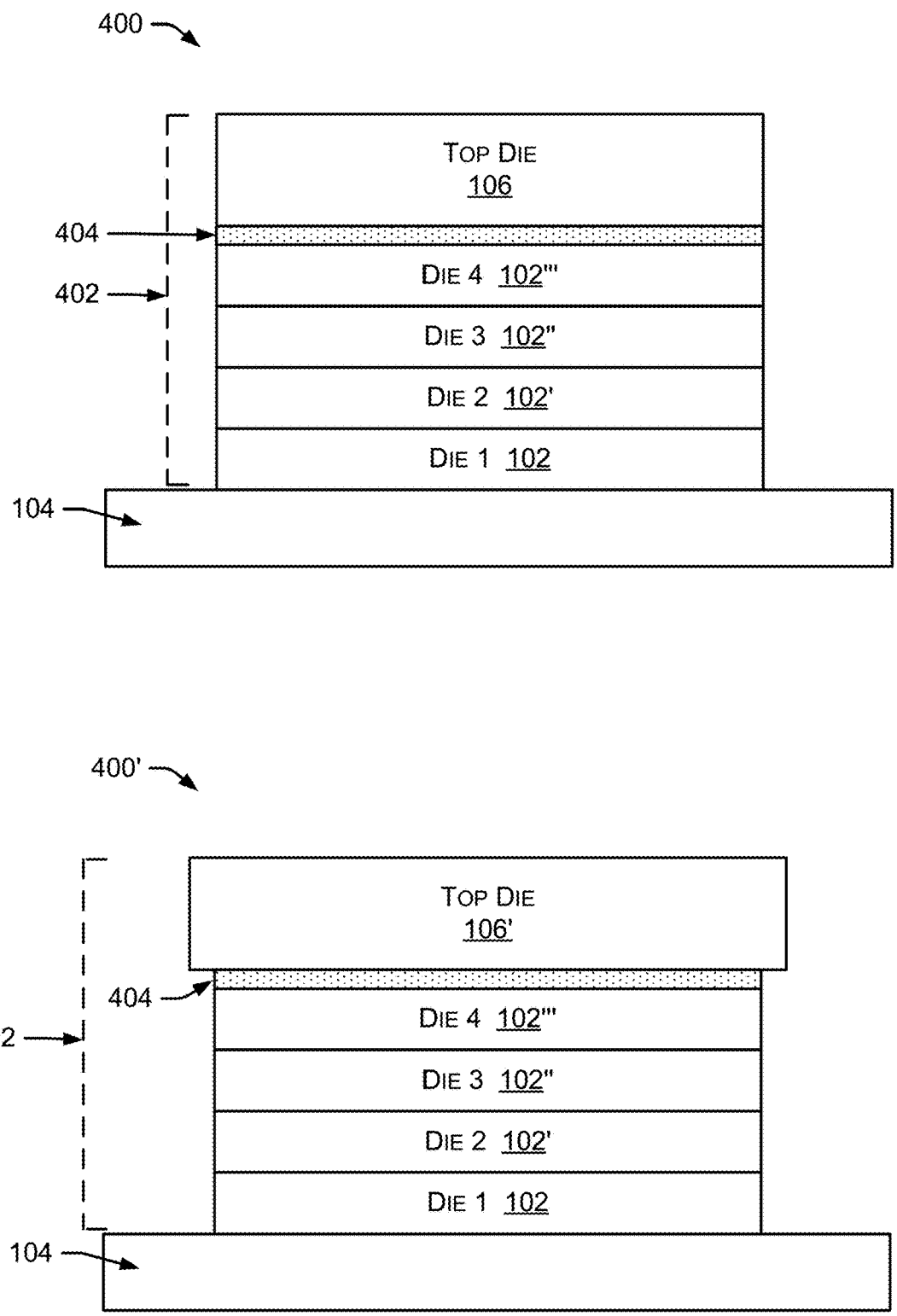
FIG. 4 is a diagram of an example module with a vertical die stack that includes a compliant layer feature for alleviating a warpage stress in the vertical stack.

FIG. 4 shows an example memory module 400 with a die stack 402 that includes a feature for alleviating a warpage stress in the vertical stack 402. The vertical stack 402 is fabricated with a compliant layer 404 intervening in between the top die 106 and the dies 102 direct bonded to each other beneath the top die 106. The top die may have different vertical and/or horizontal dimensions than at least one other die in the direct bonded die stack 400.

The compliant layer 404 is intended to cushion uneven forces during bonding of the top die 106 to the vertical stack 402, and to counteract or dissipate ongoing unevenness of stresses and warpage forces between the top die 106 and the dies 102 beneath. The thickness of the compliant material or compliant layer 404 may range between 0.5-55.0 microns and preferably between 3.0-30.0 microns. The compliant layer 404 may be adhered or bonded between the dies, and can provide a single solution to warpage when the top die 106 is a dummy die for filling the top space of the package 400. The compliant layer 404 may be adhered or bonded between the dies, and can provide a single solution to warpage when the top die 106 is a dummy die for filling the top space of the package 400. The Young's modulus of compliant layer 404 is preferably less than 4 GPa.

In some embodiments, as in stack 400, the width of the top die 106 is similar to the width of one of the dies below 102. In other embodiments, as in stack 400', the width of the top die 106' is different from a width of other dies in the vertical stack 400', and may be wider than the dies 102 below, for example.

Figure 5:
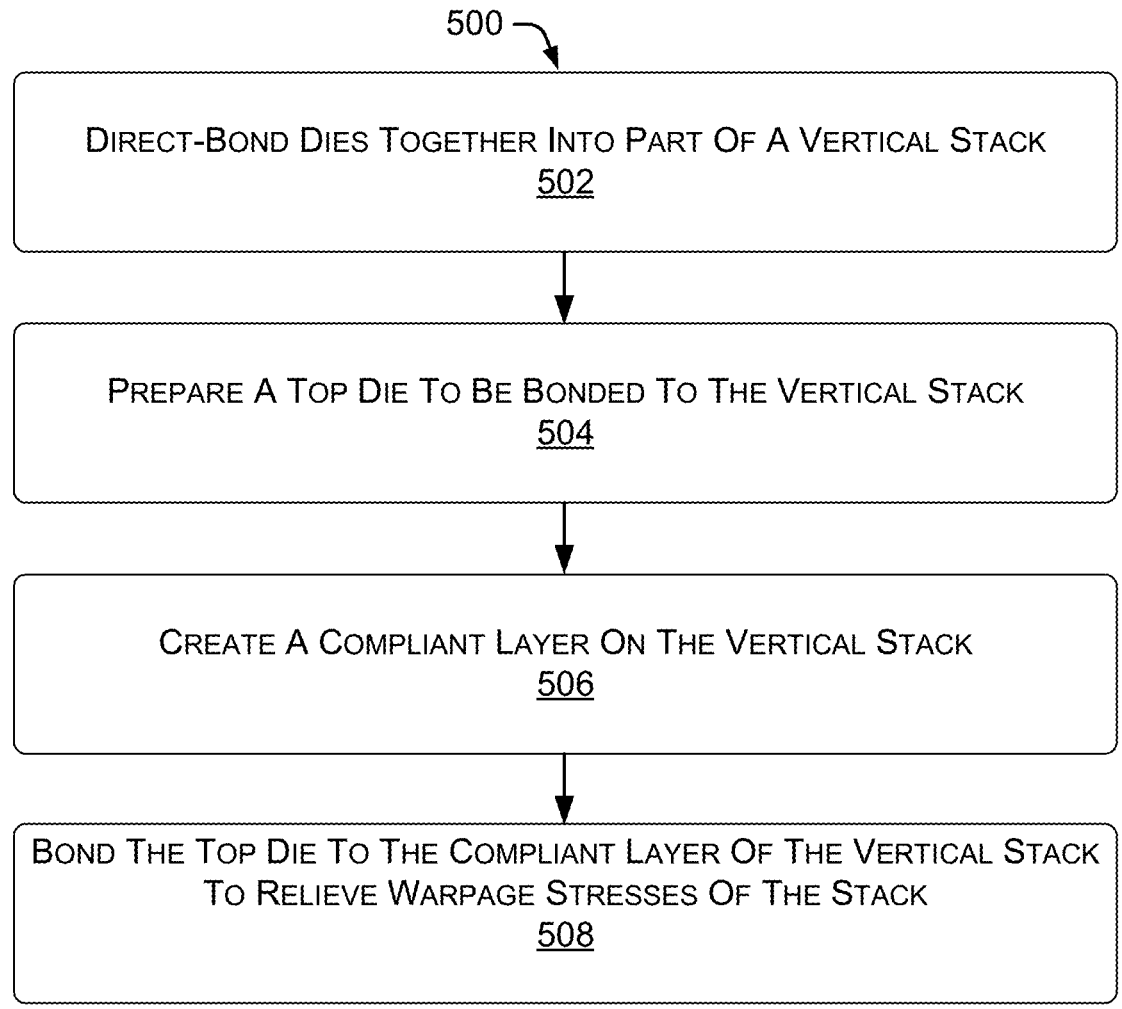
FIG. 5 is a flow diagram of an example process for fabricating the example module FIG. 4.

FIG. 5 shows an example process 500 for fabricating the example module 400 of FIG. 4. Operations of the example process 500 are shown in individual blocks.

At block 502, the example process 500 includes direct bonding dies 102 together to make part of a vertical stack 402.

At block 504, a top die 106 is prepared for bonding to the top of the direct bonded dies 102.

At block 506, a compliant layer 404 is applied to interpose between the top die 106 and other dies 102 of the vertical stack 402, for example.

At block 508, the top die 106 is then bonded to the compliant layer 404. The compliant layer may be an adhesive or another compliant material bonded by thin film die attach, printed or stenciled die attach material, or other adhesives, for example. The microelectronics package 400 with vertically stacked dies 102 & 106 and compliant layer 404 provides reduced internal stress and increased reliability, alleviating a warpage stress between the top die 106 and the dies 102 of the vertical stack 402. A flowable material that sets may be used for the compliant layer 404. The dispensed material flows and will accommodate the warpage very well. In the thin film die attach embodiment, flow is achieved at elevated temperatures and the flowed material also accommodates the height differences across warped dies to alleviate the warpage. The width of the top die 106 may be similar or different than the width of the dies below 102, as in FIG. 4.

Figure 6:
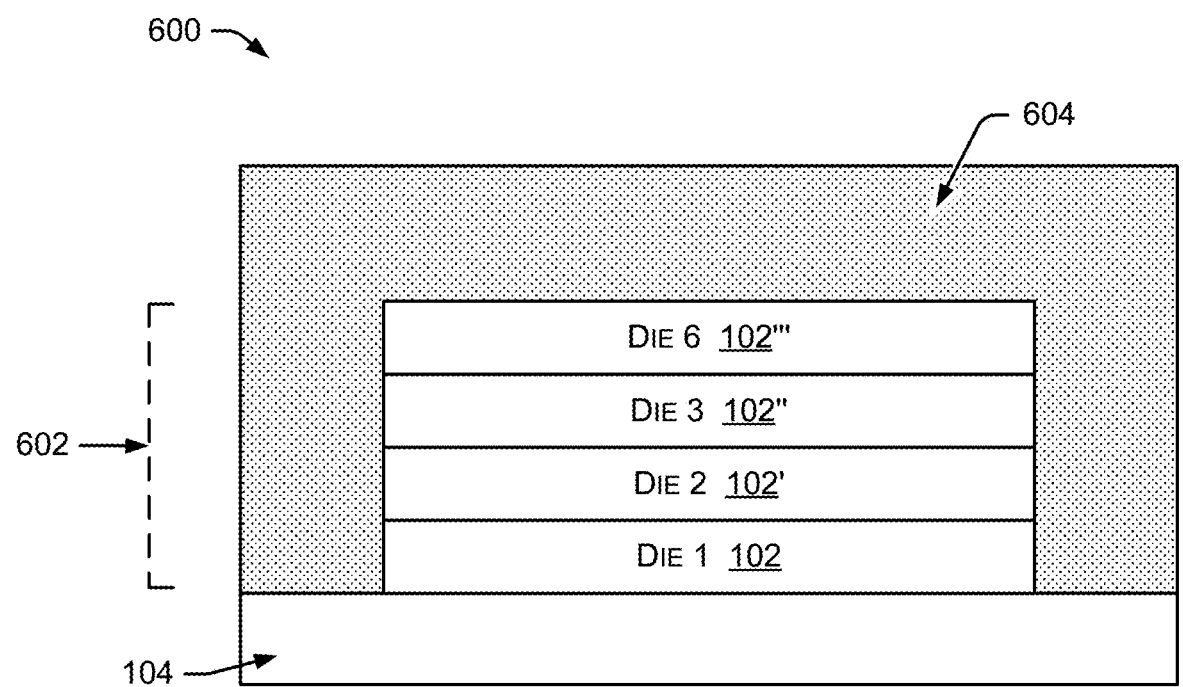
FIG. 6 is a diagram of an example module with a die stack that includes a molding feature for alleviating a warpage stress in the vertical stack.

FIG. 6 shows as example module, a microelectronics package 600 with a die stack 602 that includes a fill feature for alleviating a warpage stress in the vertical stack 602. In this example microelectronics package 600, a volume of molding material 604, filler, underfill material, etc., substitutes for a top die 106, which is eliminated in this embodiment. Since there is no conflict of warpage stresses between the positive warpage of a top die that is not present, and the dies 102 of the stack 602 that may have a negative warpage, the actual dies 102 in the vertical stack 602 remain with a slight but acceptable negative warpage, and the microelectronics package 600 is filled out with the molding compound 604 to complete the microelectronics package 600. The residual negative warpage of the direct bonded dies 102 may also be addressed and alleviated with a stress balancing layer as described with respect to FIGS. 10-11. One or more stress balancing layers (not shown in FIG. 6) can be applied on or within the stack 602 to counterbalance and cancel out the net warpage of the entire stack 602. Or, such stress balancing layers can be matched with each individual die 102 to be bonded into the stack 602.

Each stress balancing layer is designed to counteract a camber of a warped die or stack, with an opposite camber of its own, before the stress balancing layer and the warped die or stack are mated together, at which point the cambers cancel each other out resulting in a flat stack 602 with a net overall warp of zero. Also, in the microelectronics package 600, the lateral width of the molding material 604 on the either side of the stacked dies 602 is smaller than a width of the dies 102 and preferably less than 10% of the width of the dies 102. In some embodiments, the vertical thickness of the molding material abutting the top 102 die is less than the thickness of the die stack 602 and preferably less than 50% of the vertical thickness of the die stack 602.

Figure 7:
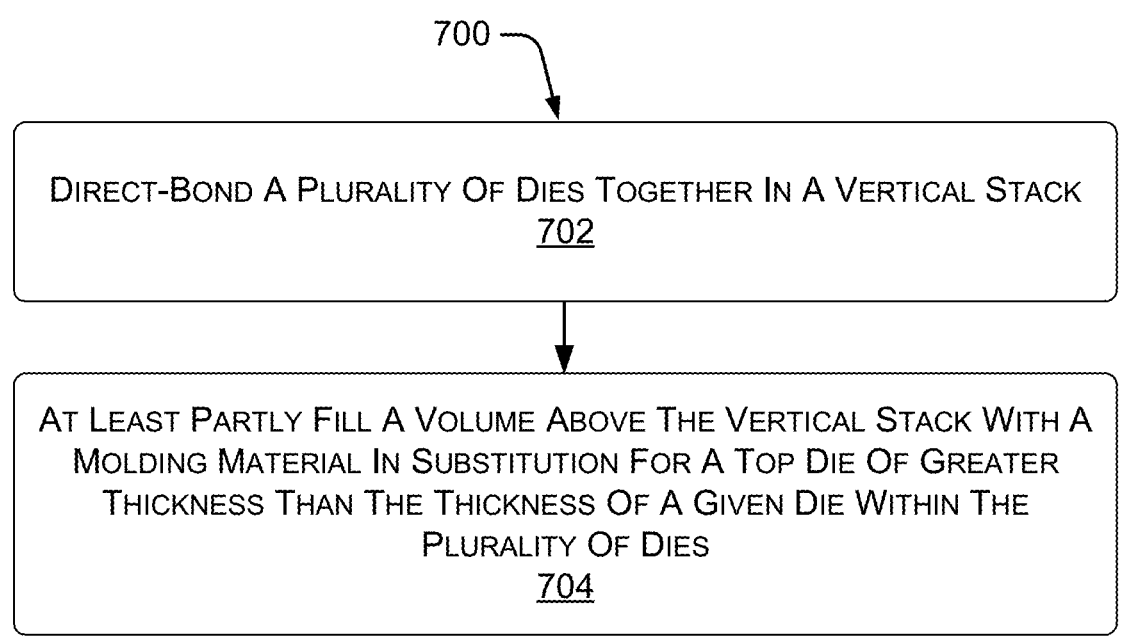
FIG. 7 is a flow diagram of an example process for fabricating the example module of FIG. 6.

FIG. 7 shows an example process 700 for fabricating the example module 600 of FIG. 6. Operations of the example process 700 are shown in individual blocks.

At block 702, the example process 700 includes direct bonding dies 102 together to make a vertical stack 602.

At block 704, molding material 604 is at least partly filled around the vertical stack 602 to substitute for the volume of the missing top die 106 and to complete the outer physical dimensions of the memory module 600 to specification. The thickness of the molding material 604 on top of the vertical stack 602 may be multiples of the thickness of an individual die 102 in the vertical stack 602. For example, the thickness of the molding material 604 may be 3 times the thickness of a die 102 in the vertical stack 602. One or more stress balancing layers may be added anywhere in or around the stack 602.

Figure 8:
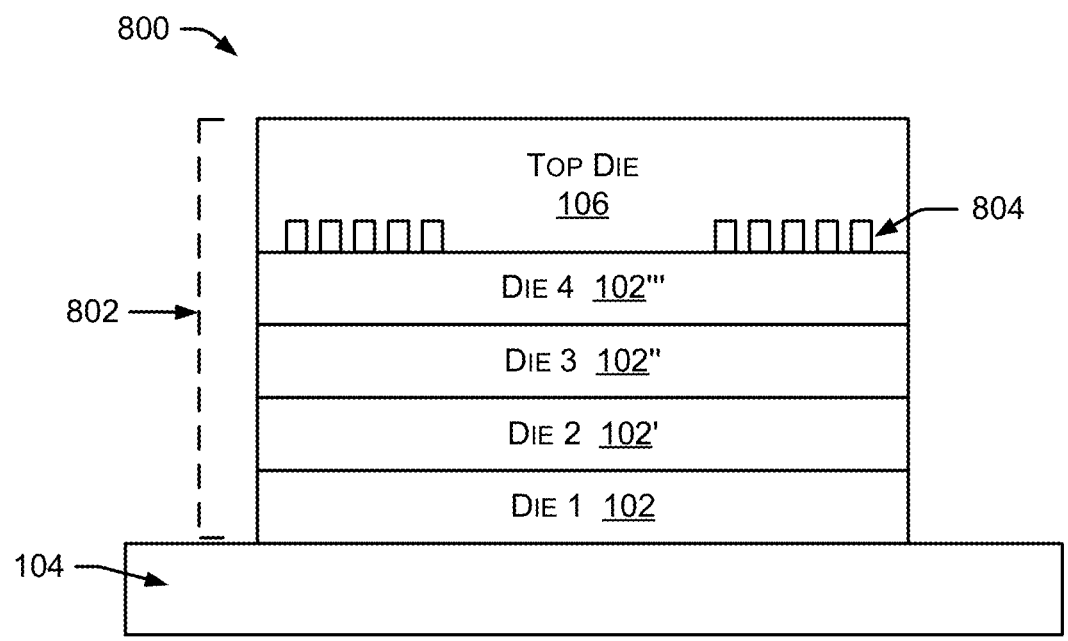
FIG. 8 is a diagram of an example module with a vertical die stack, including a relief cavity feature for alleviating a warpage stress in the vertical stack.

FIG. 8 shows as example module 800 with a die stack 802 that includes a relief cavity feature for alleviating a warpage stress in the vertical stack 802. In this example module 800, relief cavities 804 (not to scale) are made in the bonding surface of the top die 106 to relieve coupling forces between the top die 106 and at least the next die 102''' beneath the top die 106. An array of the relief cavities 804 may be placed where coupling forces are known or determined to be detrimental to the stability of the microelectronics package 800. If the top die 106 is an active die and part of the electronics of the memory module 800 (and not just a dummy die), then there may be metal interconnects, such as direct bonded interconnects, between the top die 106 and the next die 102''' beneath. Even though the metal interconnects may be rigid, the array of relief cavities 804 may still reduce and relieve coupling forces between the top die 106 and the vertical stack 802 to decrease the effect of warpage forces in the microelectronics package 800.

The example relief cavities 804 are typically formed in some portions of the dielectric regions between adjacent interconnects. In other applications, the relief cavities 804 may be formed between the interconnect portion and the edges on the die or singulation lanes. Also, the relief cavities 804 may be continuous or discontinuous and the geometrical profile of a relief cavity 804 may be triangular, rectangular or curvilinear. The depth of the relief cavities 804 may range between a few nanometers to a few microns. In an implementation, it is important that in the immediate region of the relief cavities 804, the bonding surface of the top die 106 is discontinuous from the surface of the die 102 beneath.

Figure 9:
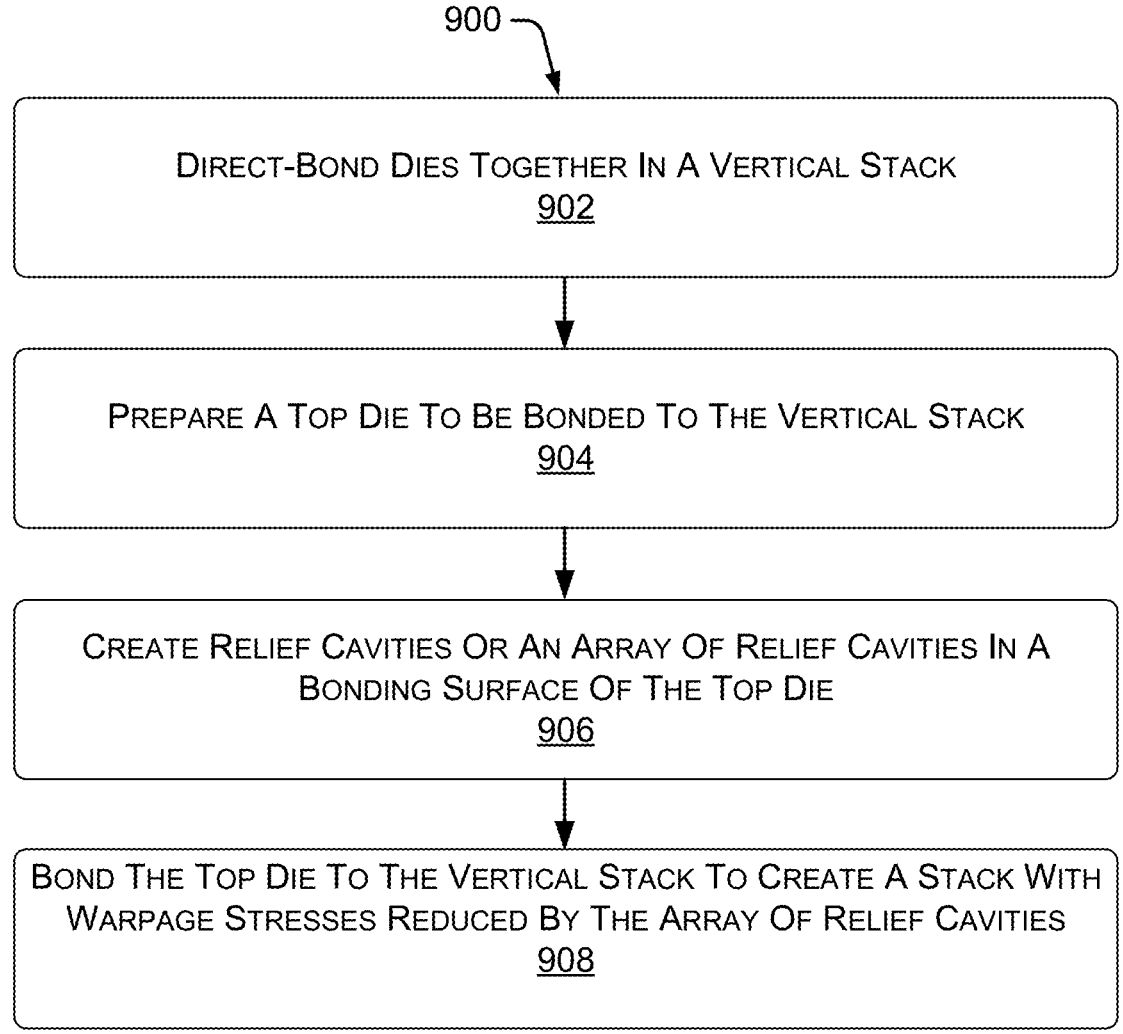
FIG. 9 is a flow diagram of an example process for fabricating the example module of FIG. 8.

FIG. 9 shows an example process 900 for fabricating the example module 800 of FIG. 8. Operations of the example process 900 are shown in individual blocks.

At block 902, the example process 900 includes direct bonding dies 102 together to make a vertical stack 802.

At block 904, the top die 106 is prepared for direct bonding to the vertical stack 802.

At block 906, relief cavities 804 are created in the top die 106.

At block 908, the top die 106 is bonded or direct bonded to the vertical stack 802 to create a microelectronics package 800 with warpage stresses alleviated between the top die 106 and the dies 102 of the vertical stack 802 to provide a more reliable package with reduced possibility of severe defects.

Figure 10:
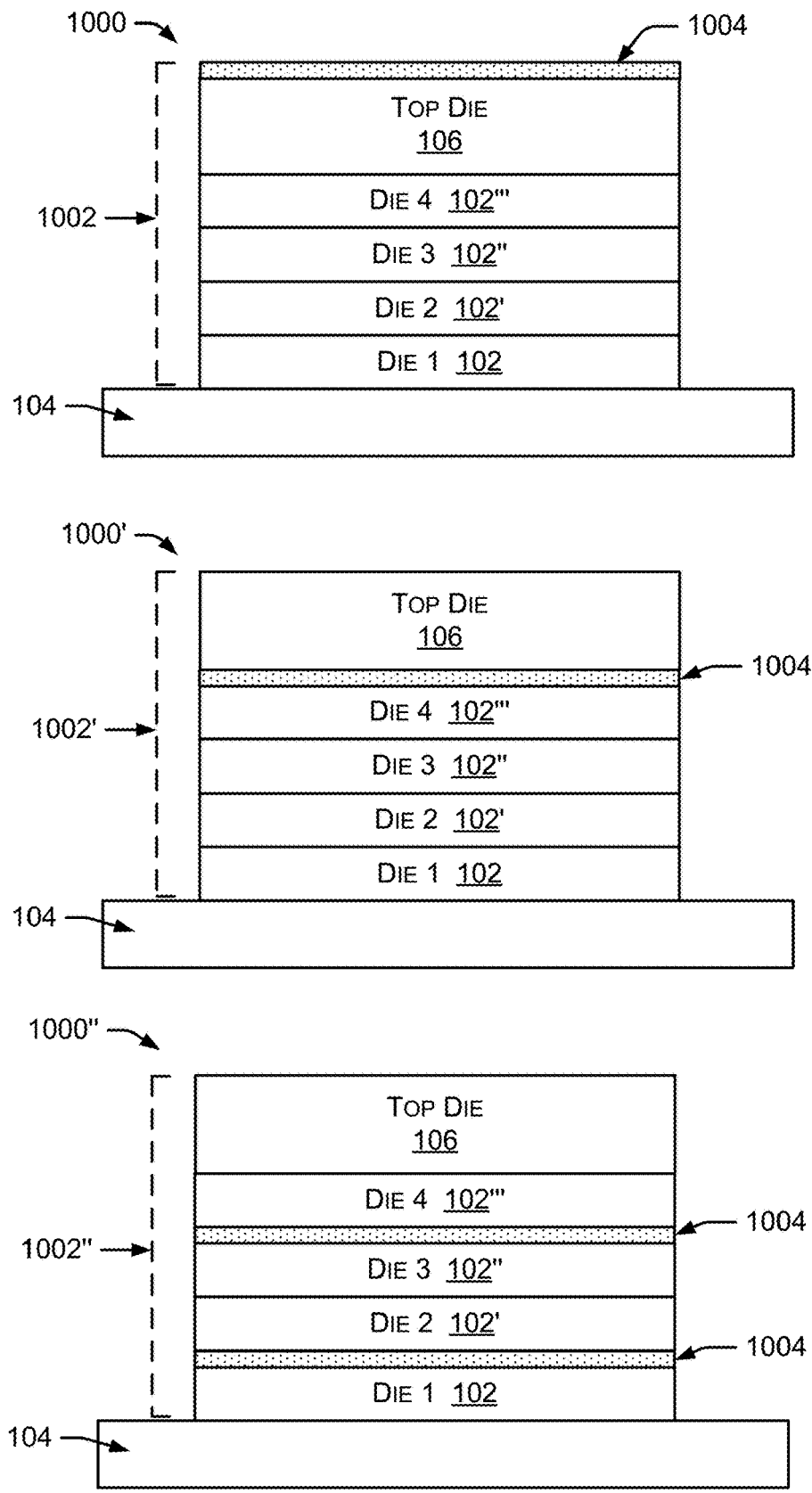
FIG. 10 is a diagram of an example module with a die stack that includes a stress balancing layer feature for alleviating a warpage stress in the vertical stack.

FIG. 10 shows as example memory module 1000 with a die stack 1002 that includes a feature for alleviating a warpage stress in the vertical stack 1002. In one example embodiment, a stress balancing layer 1004 is created on a backside of the top die 106 (topside of the vertical stack 1002 when the vertical stack 1002 includes the top die 106). The stress balancing layer 1004 may be made of a hard or firm material applied by physical vapor deposition (PVD) methods, for example, or by other application techniques to prevent warpage from occurring in the first place. The stress balancing layer 1004 may also be one or more firm materials to suppress or counteract the warpage of a die or stack, resulting from construction of the package 1000 or resulting from subsequent thermal changes during operation. The stress balancing layer 1004 may also be a layer that has a warp or camber of its own, designed to counter and cancel out the warpage or stress of a die or stack to which it will be adhered or bonded. The stress balancing layer 1004, in some configurations, can also redistribute stresses, balancing local stresses by horizontal redistribution of local warps and stress points with other local areas that have the opposite warp or stress, for a net zero overall warpage.

In some applications and structures 1000' the stress balancing layer 1004 may be coated on the lower side of the top die 106. In this arrangement, the stress balancing layer 1004 is disposed between the top die 106 and the bonded die immediately beneath the top die 106 in the stack 1002', such as die 4 102''' in structure 1000' of FIG. 10, for example.

In structure 1000", one or more stress balancing layers 1004 may be placed between the thin dies 102 in a die stack 1002", or anywhere in the stack 1002".

Such stress balancing layers 1004 can also be matched with each individual die 102 to be bonded into the stack 1002". Each stress balancing layer 1004 is designed to counteract a camber of a warped die 102 or stack 1002, with an opposite camber of its own. Thus, the stress balancing layer 1004 may apply a slight leaf spring action to the die or stack being unwarped. The opposing cambers cancel each other out when each stress balancing layer 1004 is mated to its warped die or stack, resulting in a flat stack 1002, or flatter stack 1002, ideally with a net overall warpage of zero.

In other embodiments, a stress balancing structure may comprise the stress balancing layer 1004 and a bonding layer, such as a distinct dielectric layer (not shown) and this bonding layer is disposed between the stress balancing layer 1004 and the bonded die immediately beneath, such as die 4 102" in FIG. 10, for example. In some applications, the dielectric bonding layer may be a thin adhesive layer and the thickness of the adhesive layer is substantially thinner than one of the bonded dies 102.

In an implementation, an example stress balancing layer 1004 can be made of one or more conductive layers, for example, an example stress balancing layer 1004 may be made of titanium nitride and/or tantalum (TiN/Ta), or Ta and Al as co-evaporated or co-sputtered layers, or these metals may be deposited sequentially over each other. But the example stress balancing layer 1004 is not limited to these compounds and elements. Multiple stress balancing layers 1004 may be applied and may have different coefficients of thermal expansion (CTEs) to provide different balancing force differentials at different temperatures. Moreover, a bonding layer, such as an oxide, nitride, or similar material may be formed on the stress balancing layer to enable direct or hybrid bonding to another surface. When the stress balancing layer 1004 is a nonconductor, the stress balancing layer 1004 may be able to accommodate vertical conductors, such as TSVs and/or metal interconnects transiting through a thickness of the stress balancing layer 1004.

In an implementation, the stress balancing layer 1004 can be made of a photopatterned polymer, which assembles or has a tendency to assemble into a curved geometry. A differentially photo-crosslinked SU-8 photoresist film, for example, may curve upon photolithographic patterning. In another implementation, a polymeric thin film with heterogeneous mechanical properties makes a curved or leaf spring stress balancing layer 1004 to be bonded to a warped die.

Figure 11:
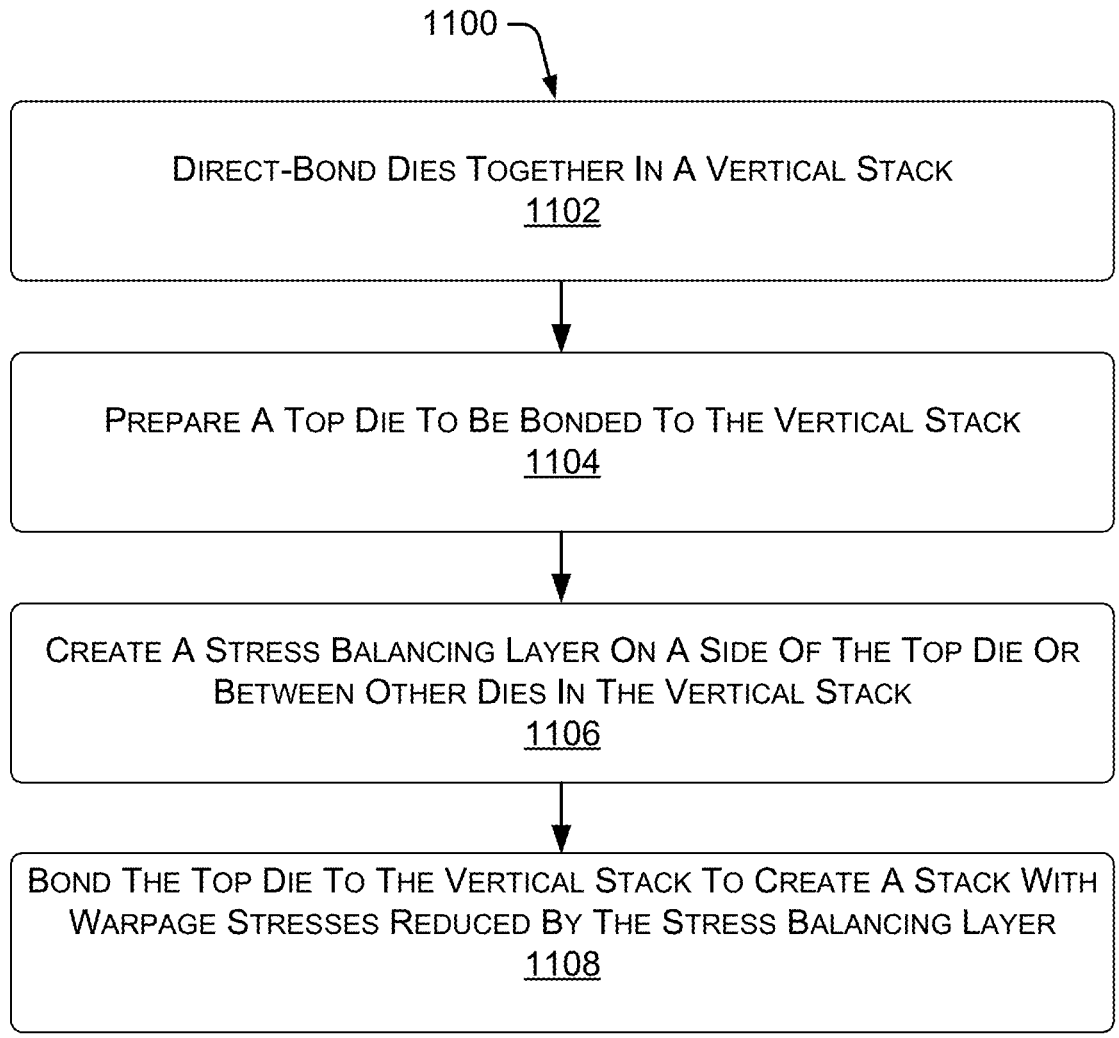
FIG. 11 is a flow diagram of an example process for fabricating the example module of FIG. 10.

FIG. 11 shows an example process 1100 for fabricating the example module 1000 of FIG. 10 including one or more stress balancing layers 1004. Operations of the example process 1100 are shown in individual blocks.

At block 1102, the example process 1100 includes direct bonding dies 102 together to make a vertical stack 1002 of the dies 102.

At block 1104, a top die 106 is prepared for direct bonding with the vertical stack 1002.

At block 1106, the top die 106 is associated with a stress balancing layer 1004. In one example process, the top die 106 is pre-coated with the stress balancing layer 1004 prior to its attachment to the vertical stack 1002. After the attachment step, the new stack may be processed further, for example, undergoing thermal annealing or molding operations.

At block 1108, the top die 106 and stress balancing layer 1004 are bonded to the dies 102 in the vertical stack 1002.

In a variation of the example process 1100, one or more stress balancing layers 1004 are placed anywhere in a stack of dies to balance stresses or cancel warpages of a die, a group of dies, or an entire stack of dies.

Figure 12:
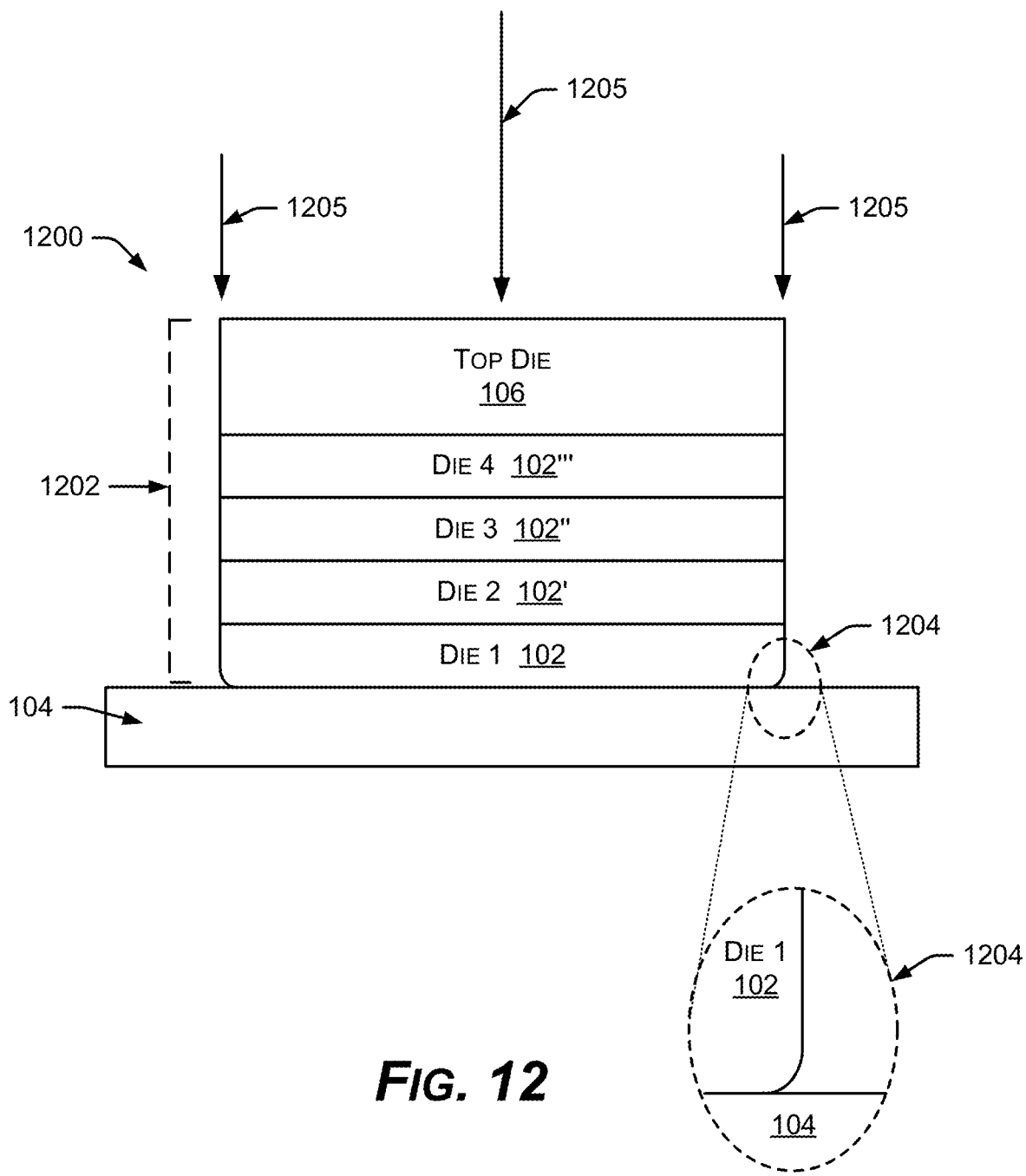
FIG. 12 is a diagram of an example module of vertically stacked dies with at least some rounded corners or edges to prevent stress concentration at corners.

FIG. 12 shows a memory module 1200 of vertically stacked dies 102 direct bonded together. Right-angle corners 1204 of some dies 102 in the stack 1202 can be rounded in the x-, y-, and/or z-directions to prevent stress concentration: a concentration of pressing forces 1205 at the conventionally squared corners 1204 of the dies 102 during stack fabrication. The pressing forces 1205 can conventionally crack and chip the fragile dies, or the substrate 104, below the 90 degree corners. Rounding, chamfering, or otherwise easing the typically sharp 90 degree corners or the edges between the z-plane and the x/y-planes can prevent or disperse transmission of the concentrated pressing forces 1205 to the relatively fragile and brittle dies, or the substrate 104, beneath. In one embodiment, the edges of the bonded dies 102 of stack 1202 are rounded to prevent point stresses at corners 1204. In other applications, the edges of the top die 106 may also be rounded.

Figure 13:
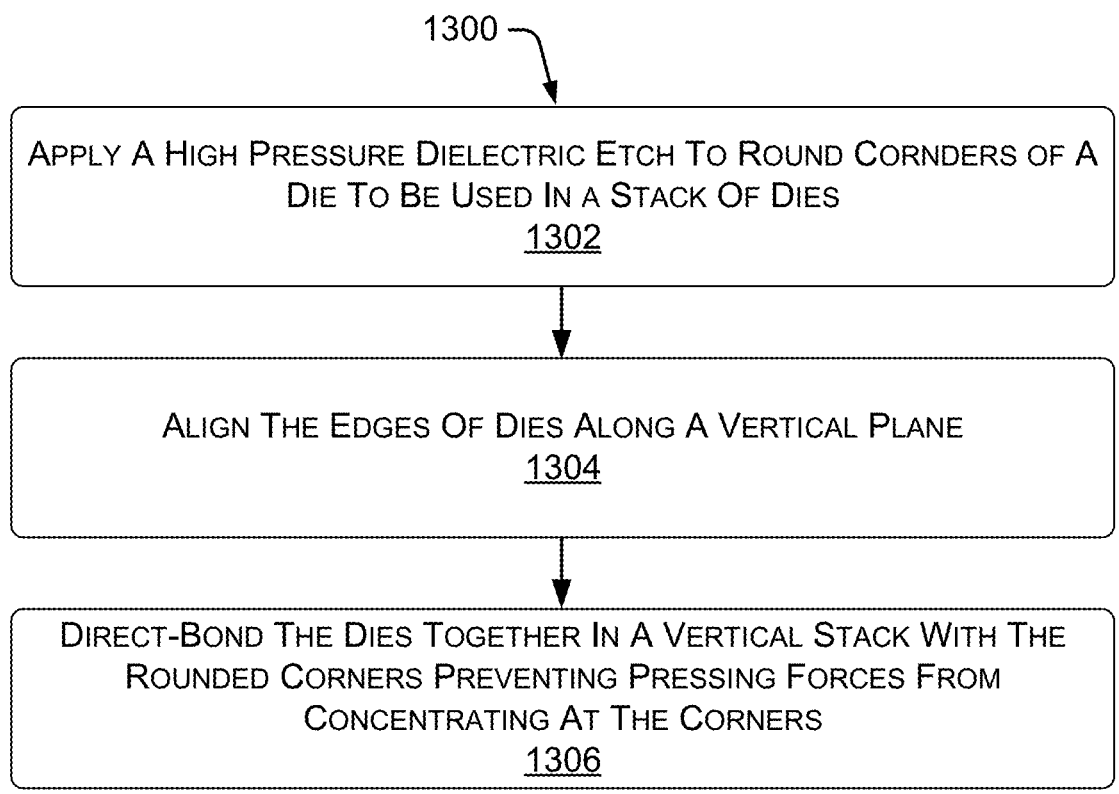
FIG. 13 is a flow diagram of an example process for preventing concentration of damaging forces in fabrication of a vertical stack of dies.

FIG. 13 shows an example process 1300 for preventing concentration of damaging forces in fabrication of a vertical stack of dies 1202. Operations of the example process 1300 are shown in individual blocks.

At block 1302, the example process 1300 includes rounding right-angle corners of selected dies to be made into the vertical stack of dies 1202. The corner-rounding can be achieved, for example, by applying a high pressure dielectric etch during a plasma etching operation. The etching operation may comprise etching the substrate 104 and coated dielectric layers. In other cases, the edges of the dielectric of the bonding surface need to be rounded prior to the bonding operation. In some applications, the boding surface may be shielded with a protectant and the selected edges may be rounded by wet etching methods or by mild abrasive powder blasting operations, or by laser jet methods or combinations thereof. The dies 102 to be used in the stack 1202 are then lined up according to a vertical plane. The dies 102 with at least some rounded corners 1204 are direct bonded together into a stack 1202, with the rounded corners 1204 preventing pressing forces from concentration at the corners 1204 and also preventing these forces from being transmitted to break, crack, or chip the next die or substrate 104 below.

Figure 14:
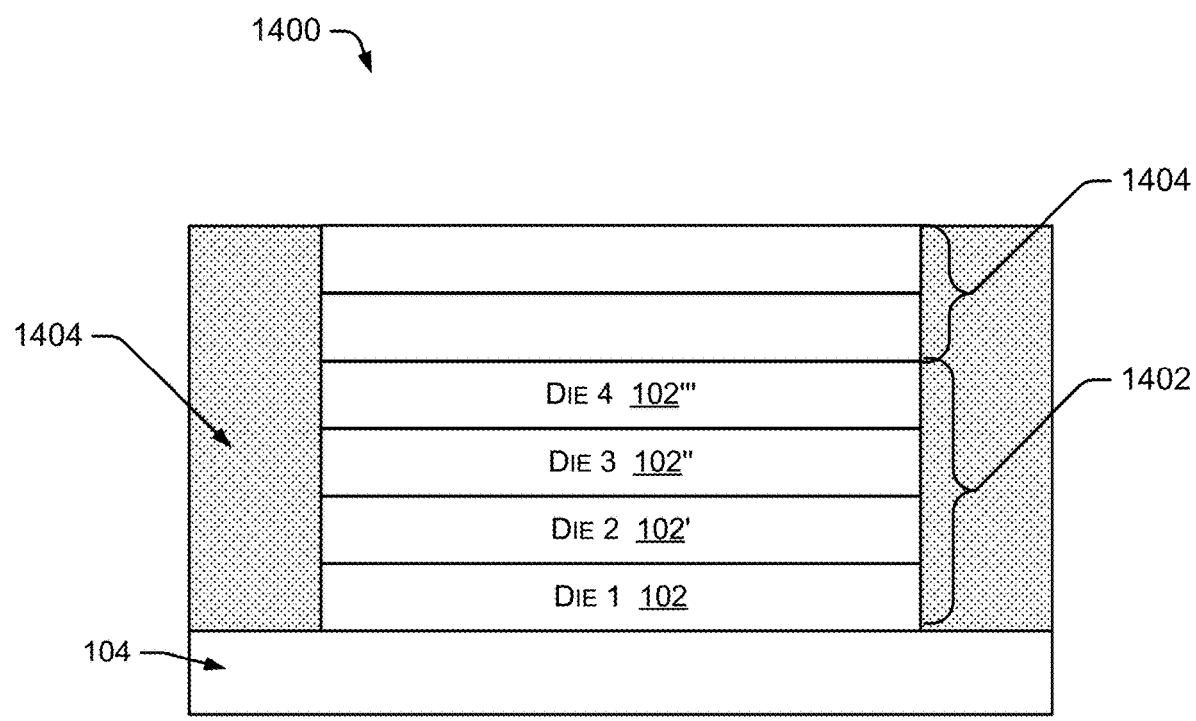
FIG. 14 is a diagram of an example module with multiple thin dies substituting for a large die to reduce stress warpage in a die stack.

FIG. 14 shows another example module 1400, memory module, or other stacked device, constructed according to one or more techniques for reducing stress warpage in the die stack 1402 making up the module 1400. In this implementation, instead of using a large monolithic die on top of the die stack 1402, two or more thinner dies 1404 are bonded on top of the stack 1402 of smaller dies 102. These thinner dies 1404 on top either conform to the stack below 1402 or can impose a counter-warpage to that of the warpage of the stack 1402 underneath. In some arrangements, a molding material 1406 laterally surrounds the bonded die stack 1402.

Figure 15:
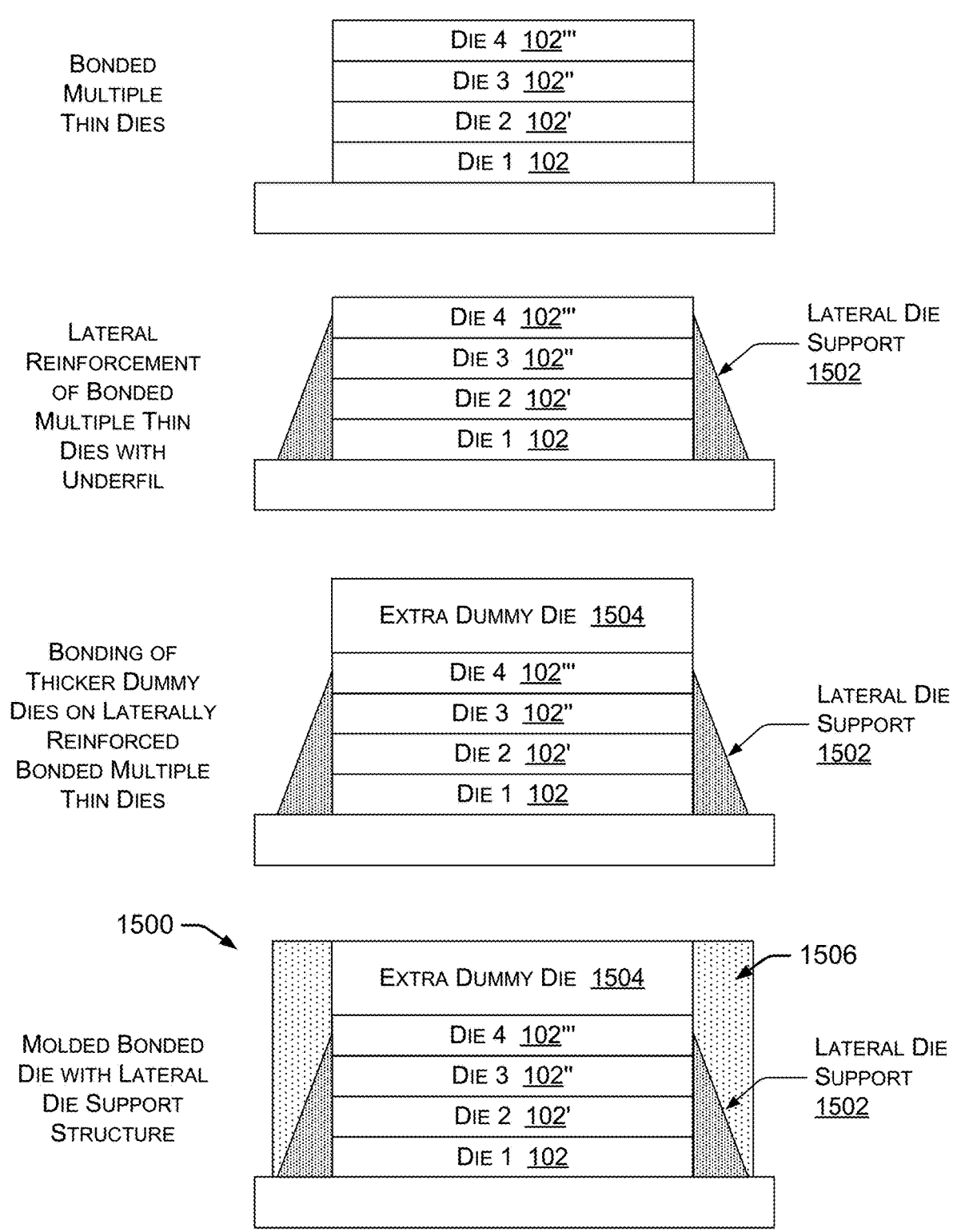
FIG. 15 is a diagram of an example structure including a lateral support for eliminating warpage problems and increasing yield in fabrication of modules with vertical die stacks.

FIG. 15 shows another example structure 1500 for eliminating warpage problems and reduced yield in fabrication of modules, such as memory modules and other devices with stacked dies.

A stack of the dies 102 are provided with a lateral support 1502, such as side buttresses made of underfill material or another firm solid or particulate composite layer. Since the individual dies 102 can be very thin, such as 55 µm in thickness or even thinner, they may be prone to warping. Before a thick top die 1504 is bonded to the stack, the lateral supports 1502 are built against the sides of the stack. These one or more lateral die support structures 1502 may be formed by various dispensing methods including printing or molding methods. During direct bonding of a top dummy die 1504 (or active die) to the stack of dies 102, for example, the lateral supports 1502 hold the edges of the dies and also stabilize the stack of dies 102 as a whole. A lateral support structure 1502 also reduces incidences of damage to the bonded dies from routine handling operations. This results in a finished module, in which the various dies 102 and 1504 are less prone to chipping or cracking on account of the solid stabilization of the lateral supports 1502. Side molding 1506 may also be added to further stabilize the stack 102 & 1504 and complete the package. It is of note that the lateral support structure 1502 abuts the periphery of the bonded dies 102 and not that of the top die 1504. Also, the side molding 1506 is disposed around the bonded dies 102 and the top die 1504, but the side molding 1506 is not in direct contact with the lower dies 102 of the stacked bonded dies, such as die "1" 102 and die "2" 102', for example. Thus, the side molding 1506 directly abuts only some portions of the bonded dies in the bonded dies stack.

Figure 16:
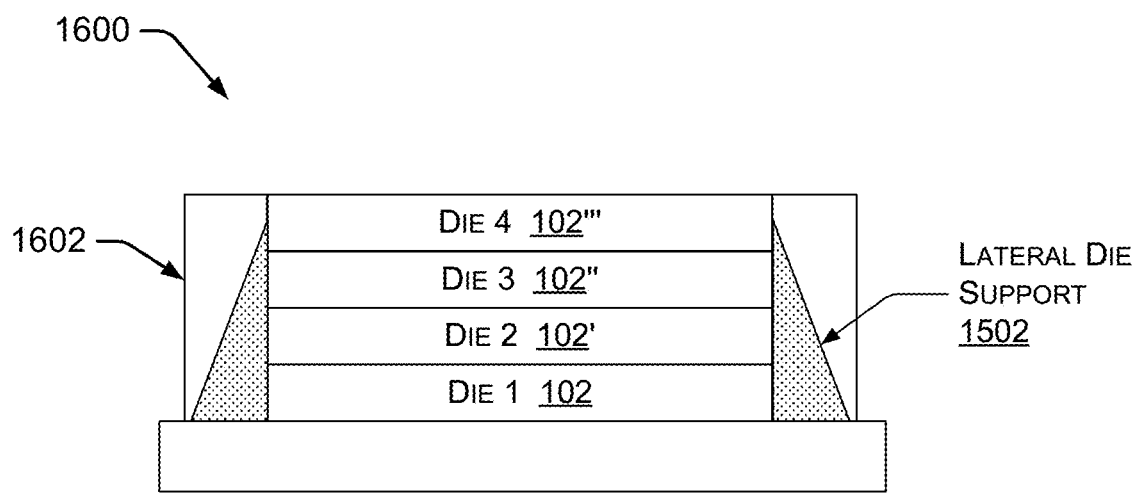
FIG. 16 is a diagram of an example structure with no top die spacer, and with lateral support structures and molding, for reducing interior stresses.

FIG. 16 shows an implementation of a structure 1600 similar to the structure 1500 of FIG. 15, but the example module 1600 does not use a top extra die 1504. In this case, side molding 1602 may be used after the lateral supports 1502 are placed, in order to complete a shorter package 1600. As described earlier, the side molding 1602 directly abuts some portions of the topmost die or dies, and not the other bonded dies in the bonded dies stack. In one embodiment, the side molding 1602 does not directly contact the stacked bonded dies.

Figure 17:
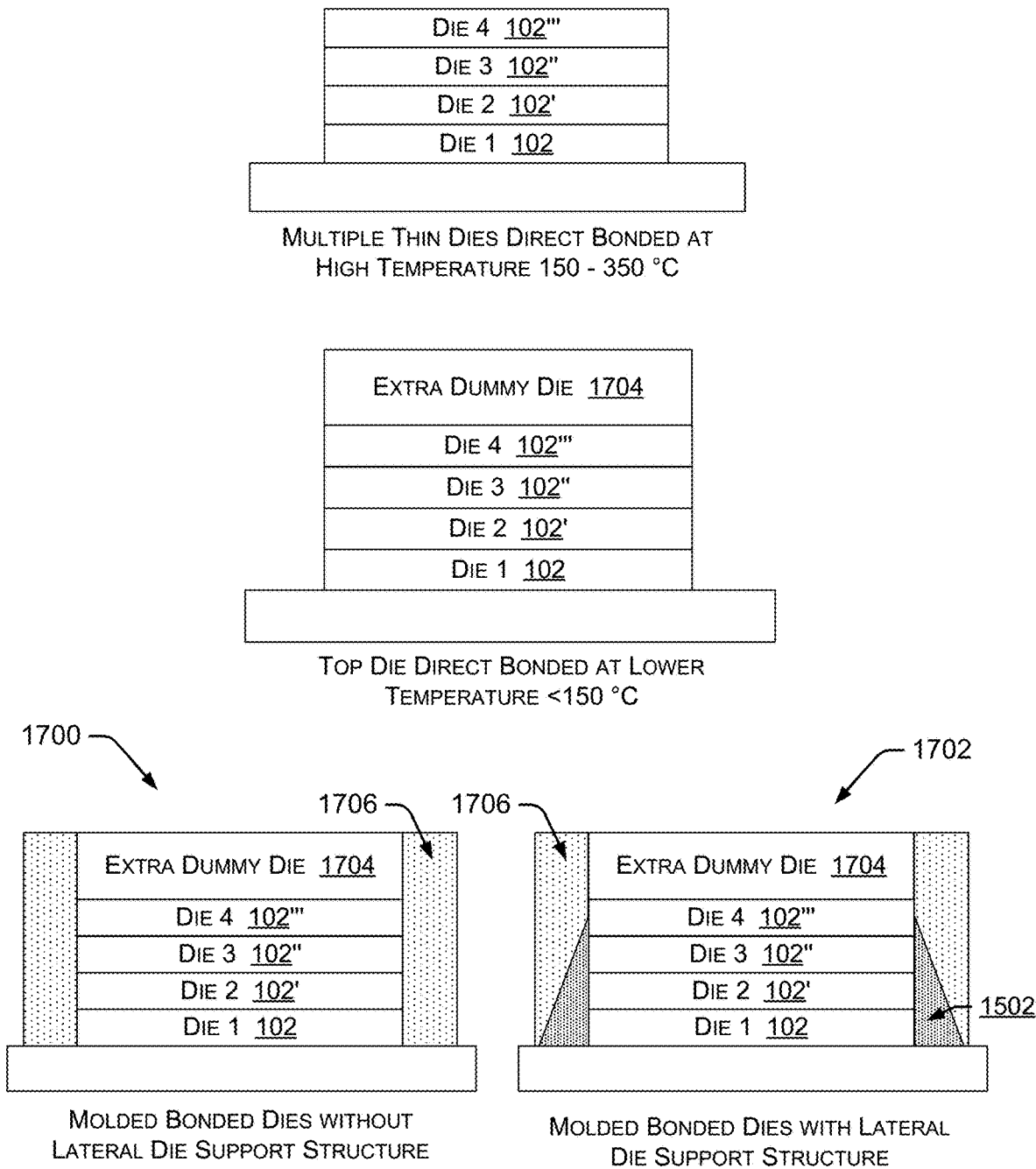
FIG. 17 is a diagram of example structures formed in a process that uses temperature differentials to reduce warpage stresses during fabrication of vertical stacks of dies.

FIG. 17 shows additional example structures 1700 & 1702 for creating modules with stacked dies 102 while reducing stress warpage when the dies 102 are direct bonded in a stack. The example technique also applies when an extra dummy die 1704 is direct bonded on top of the respective stacks with a concavity of warpage that may be different from that of the stack of dies 102 beneath it.

First, in an example process, multiple thin dies 102 are direct bonded together at a first temperature, for example in the approximate range of 140-350° C. The top die, the extra dummy die 1704, is then bonded to the stack of dies 102 at a second temperature preferably lower than the first temperature. In one embodiment, for example, the multiple thin dies 102 may be bonded at a temperature sufficiently high for a metallic bond to form between mating metallic electric contacts between intimately mated dies. For example, the mating temperature for the opposing electrical and non-electrical contacts may range between 150-300° C., and preferably between 180-250° C. for a time duration ranging from 45 minutes to 2-4 hours or even longer. The bonding temperature depends on the nature of the mating metal layer. In practice, the higher the bonding temperature, the shorter the bonding times and vice versa.

The stack of dies 102 is allowed to cool to the lower bonding temperature for additional processing if needed before attaching the top extra dummy die 1704 to the upper surface of the last die in the stack of dies 102. The attached dummy die 1704 is then bonded at a temperature preferably lower than the metallic mating temperature of the bonded stacked dies. In one embodiment, the dummy die 1704 is bonded at temperatures ranging from below room temperature to below 130° C., and preferably below 100° C. Reducing the bonding temperature of the top die 1704 reduces the stress transmitted from the die 1704 to bonded dies beneath, such as in example stacks 602 (FIG. 6), stack 1402 (FIG. 14), and stack 1801 (FIG. 18).

In one implementation, the warpage state of the stack of dies 102 direct bonded at the higher temperature and then cooler to the lower temperature is memorialized and "fixed" by adding a lateral support 1502 of underfill or other solid material to stabilize the stack. In another implementation, the package is stabilized and/or completed with molding material 1706 on sides as needed.

Figure 18:
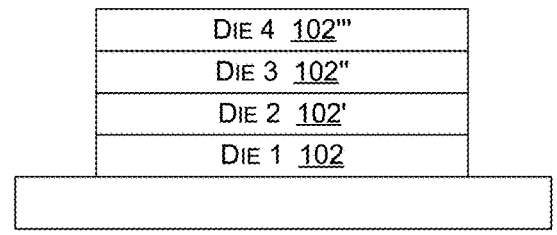
FIG. 18 is a diagram of example structures and associated processes for making an example module of stacked dies by uniting multiple pre-made stacks of dies, while reducing interior stress warpage.
Figure 18:
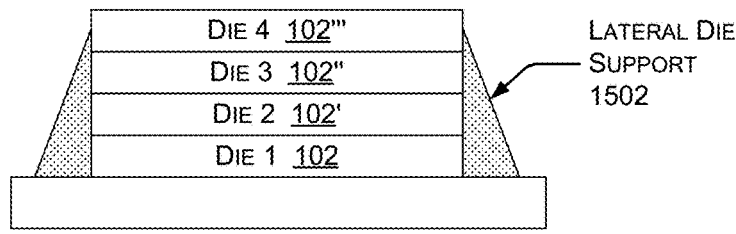
Figure 18:
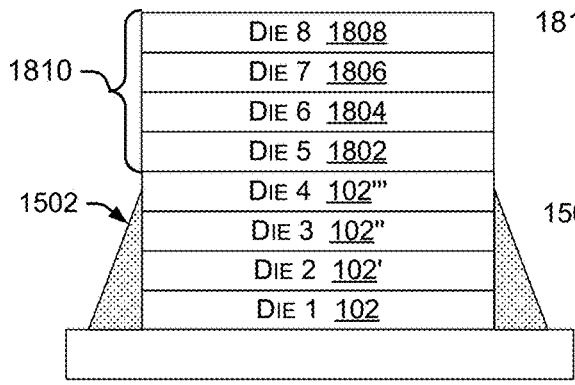
Figure 18:
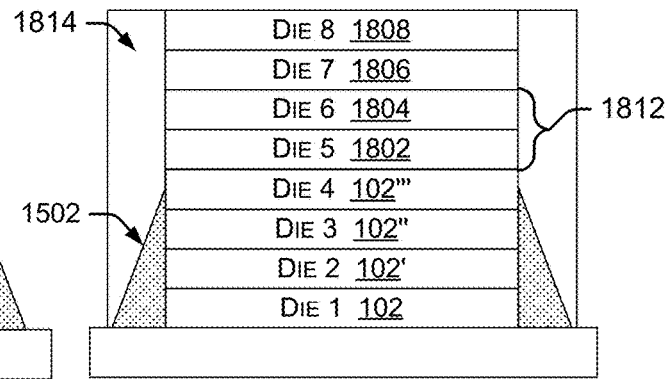

FIG. 18 shows example structures and associated processes for making an example module 1800 of stacked dies that has reduced interior stress warpage and/or a higher manufacturing yield due to less failure from warpage during fabrication. A first stack of dies 1801 is assembled by direct bonding thin dies 102 to each other, or by other bonding means. Underfill or other solid material is used to make lateral supports 1502 for the stack of dies 102, thereby stabilizing the stack of dies 102 in a non-warped state.

Another stack 1810 of dies 1802 & 1804 & 1806 & 1808 are made separately, applying one or more of the anti-warping measures as described herein. This pre-made stack 1810 of additional dies is then bonded or direct bonded to the initial stack of dies 102, rather than just continuing the initial single stack 102 by adding the individual additional dies 1802 & 1804 & 1806 & 1808 one-by-one, which would propagate and further exaggerate the negative warpage of the initial stack of dies 102.

In an implementation, a layer 1812 topping the initial stack of dies 102, which would be an extra dummy die in conventional modules to fill out the package, is made of active dies 1802 & 1804 in this implementation of the microelectronic device or module 1800 being assembled, these dies 1802 & 1804 are not dummy dies. The module 1800, now containing two stacks of dies 102 & 1810 direct bonded together, can be filled out and completed with a molding material 1814.

It should be noted that in one implementation, the lateral supports 1502 made of underfill material, for example, represent a first encapsulation that touches, supports and stabilizes only the dies 102 of the first stack of dies 102, while the molding material 1814 added later represents a second encapsulation that touches, supports, and stabilizes only the dies of the second stack 1810. Thus all dies in the two stacks 102 and 1810 get stabilized in a non-warped configuration by encapsulants, but in a different manner for each of the stacks as the module 1800 is assembled. The first stack of dies 102 receives lateral supports 1502 from a buttressing underfill material, while the next stack of dies 1810 receives non-warp stabilization from side molding 1814 that completes the package.

Figure 19:
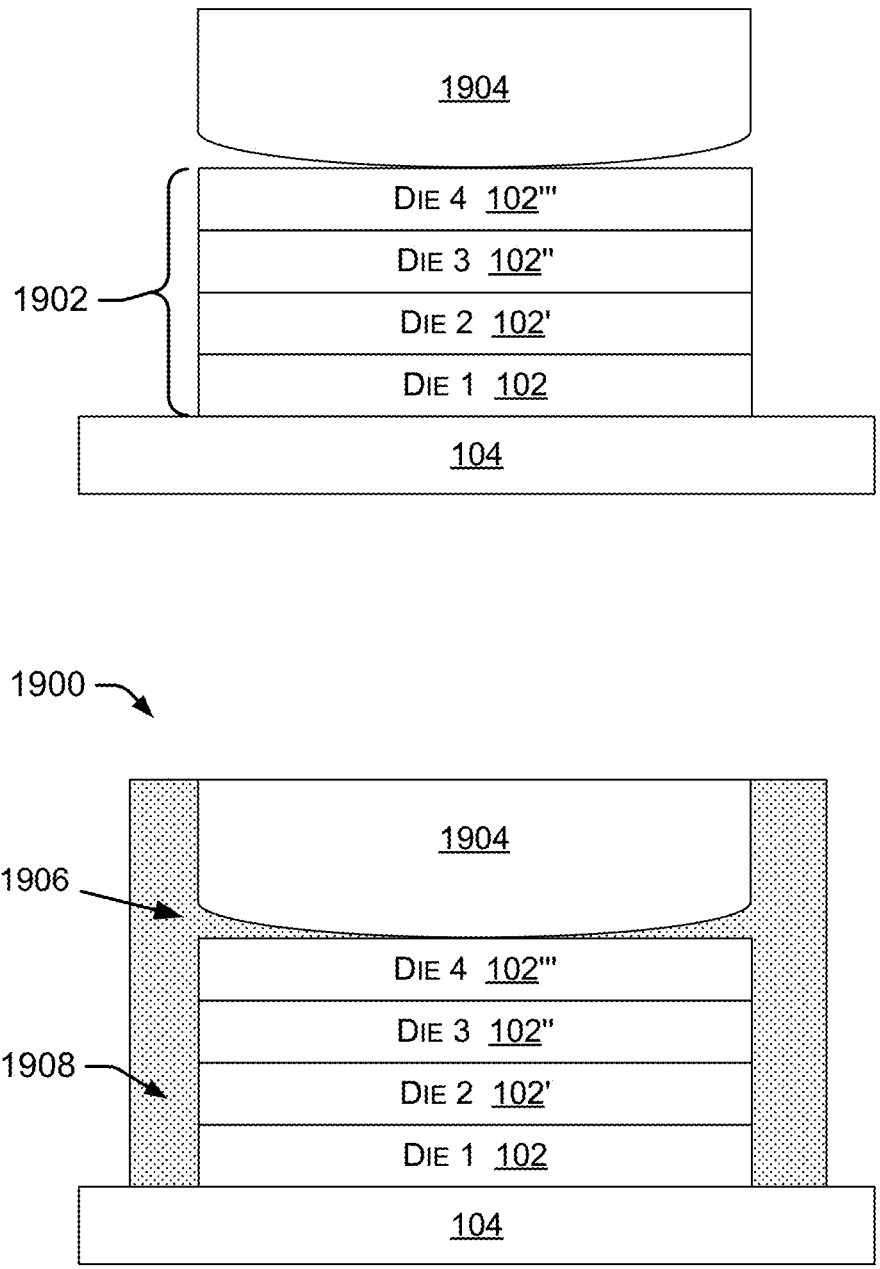
FIG. 19 is a diagram of an example structure with features for alleviating warpage stresses in stacks of dies, including rounded die corners supported by an encapsulant fillet or wedge.

FIG. 19 shows another example structure 1900 and method for alleviating warpage stresses in stacks of dies and microchips, especially when the dies are very thin. An example module 1900 with a stack 1902 of dies 102 is built on a substrate 104, such as a semiconductor wafer, carrier, panel, or interposer, etc.

In an implementation, a top die 1904 is added to the stack of dies 102 to bring the package to a height specification. The top die 1904 may be a dummy die, but can also be one or more active dies. In an implementation, the top die 1904 is thicker than the individual dies 102 making up the stack 1902 beneath it, and so is subject to warping in its own right. The bonding surface of the top die 1904 may be formed by photolithographic and selective material methods. In one example, the bonding surface of die 1904 may be selectively protected with an organic or inorganic resist protective layer for example. The unprotected portion of the bond surface may be etched by a dry or a wet method to remove sufficient materials to prevent the etched regions from contacting the top bonding surface of the die 102 immediately beneath during and after the bonding operation.

After the material removal step on die 1904, the protective layer is stripped, the bottom bonding surface of the top dies is cleaned, prepared and bonded to the top surface of die 102. The top die 1904 may be imparted with rounded edges on its bonding side proactively. The top die 1904 is direct bonded to the stack of dies beneath it at its middle region forming a peripheral gap beyond the bonded region. In this configuration, the prepared bonding surface of the top die 1904 is smaller than the bonding surface of die 102 beneath. Reducing the bonded area between top die 1904 and the die beneath, for example die "4" 102''', reduces the force transmitted to the bonded dies beneath. In one embodiment, an encapsulant wedge or fillet 1906 may be applied to fill the peripheral gap beyond the bonded region of die 1904. The encapsulant fillet 1906 may comprise or incorporate a particulate material to reduce the thermal expansion of the encapsulant material. In other embodiments, underfill material or a molding material 1908 may be applied to encapsulate the bonded dies, such as dies 102 and die 1904, and to fill the fillet 1906 between the top die 1904 and the die 102''' beneath.

The encapsulating material 1908 firmly couples the bonded dies stack 102 and the top die 1904 to form an integrated solid structure and also acts as a protective layer thereby preventing stress cracking and delamination between the stack of dies 102 and the top die 1904. The fillet 1906 of compliant material may also be the same material as the molding 1908 around the sides of the stack 102 & 1904, which completes the package 1900.

Figure 20:
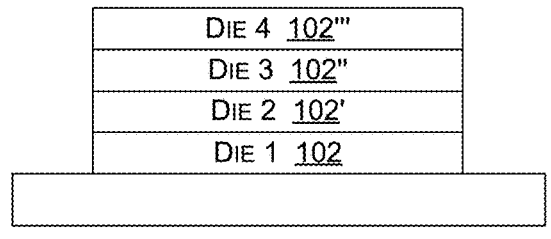
FIG. 20 is a diagram of example structures for constructing larger modules that have numerous stacked dies, without introducing problems caused by stress warpage.
Figure 20:
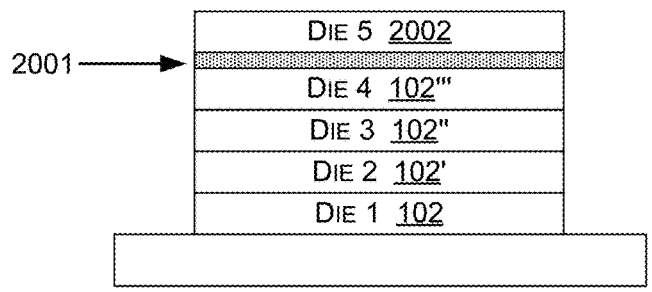
Figure 20:
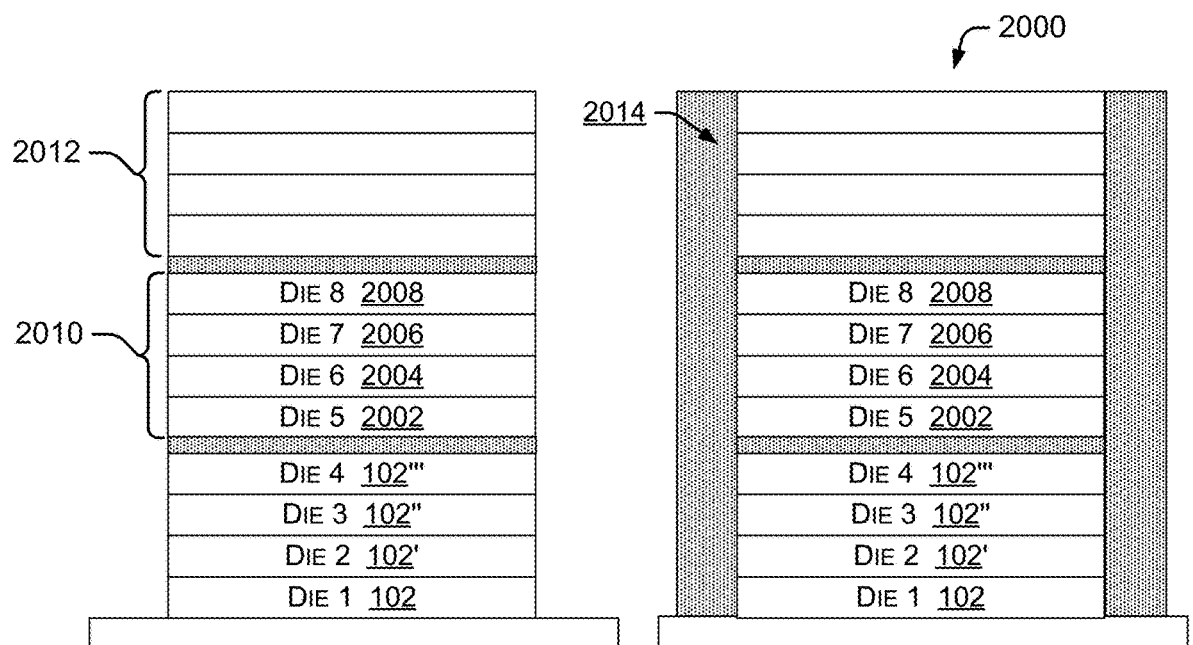

FIG. 20 shows another example scheme for constructing larger modules 2000 that have numerous stacked dies, without introducing problems caused by stress warpage, which decrease yield during fabrication. In this embodiment, a compliant layer 2001 is added at intervals, between groups of dies, such as between a first group of dies 102, a second group 2010 of dies 2002 & 2004 & 2006 & 2008, and a third group 2012 of active or dummy dies. In one embodiment, the compliant layer 2001 comprises one or more conductive vias for electrically connecting conductive features on the backside of die "4" 102''' to the conductive features of die "5" 2002. In some applications, the layer 2001 may comprise one or more low melting point conductive materials (for example solder) for connecting desirable portions of die "4" 102''' to similar portions in die "5" 2002.

In an implementation the dies 102 and compliant layers 2001 are stacked up individually, one die 102 or layer 2001 at a time, by direct bonding or direct hybrid bonding, for example. In another implementation, the groups of dies 102 & 2010 & 2012 are constructed separately, and groups of dies are added to the overall stack as grouped units.

When the overall stack of dies 102 & 2010 & 2012 is completed, the stack may be encapsulated with molding 2014 or the same compliant material as used in the compliant layers 2001.

Figure 21:
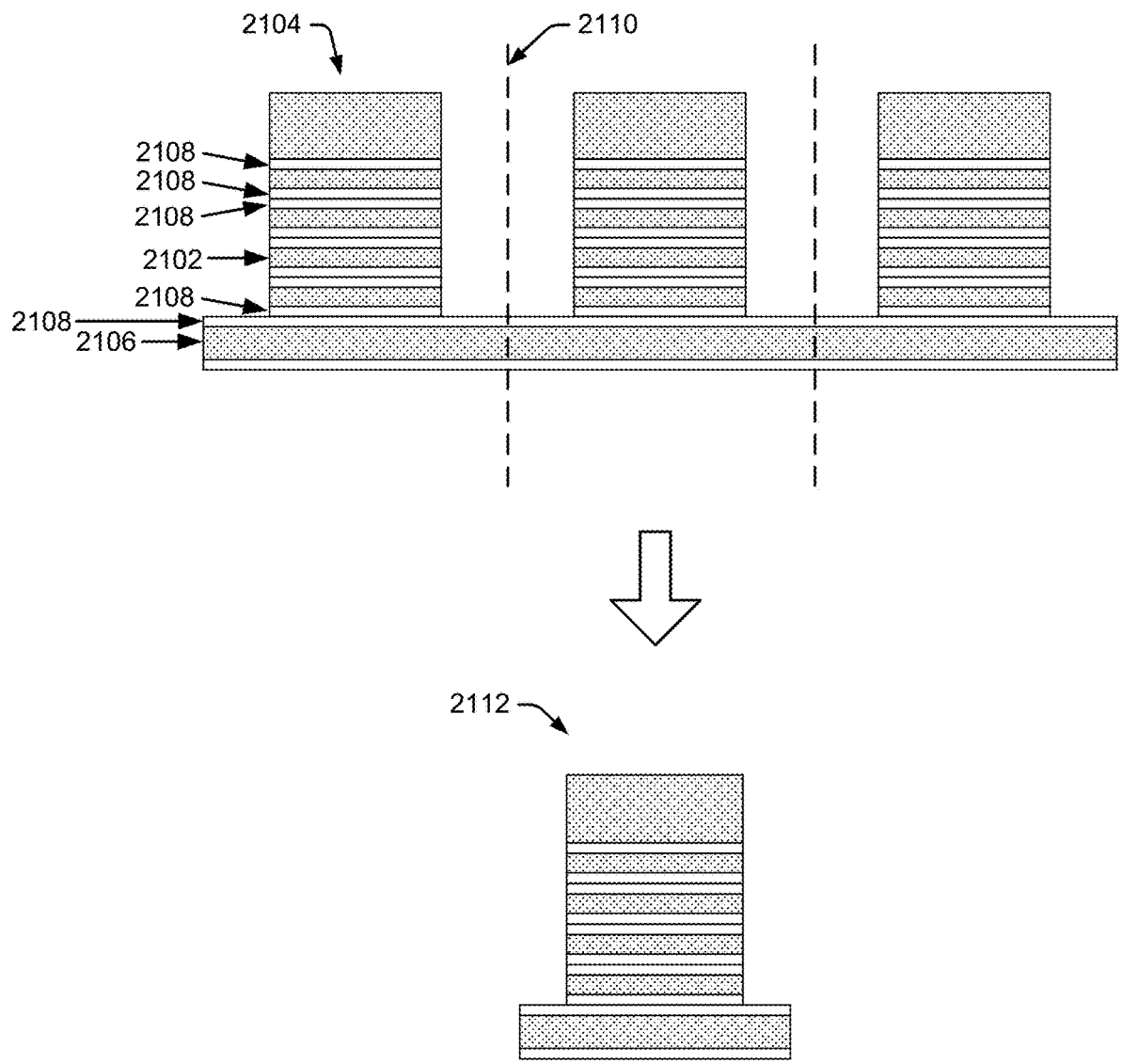
FIG. 21 is a diagram of example structures including thin layers of dielectric material and features for reducing interior stresses.

FIG. 21 shows thin dies 2102 direct hybrid-bonded together into stacks 2104. Each stack 2104 is built on a common wafer substrate 2106, for example, or carrier, panel, etc. Thin layers of dielectric and metal 2108 (direct hybrid bonding layers 2108) on the dies 2102 and substrate 2106 enable the direct hybrid bonding. That is, the bonding layer 2108 may consist of multiple layers, and/or may consist of a combination of dielectric material(s) and metal (s). The dielectric may consist of multilayer dielectrics including but not limited to diffusion barrier layers and dielectric layers for bonding which consist of Si, O, N, and C. Additionally, layer 2108 may also contain metal materials as conductive pads, wherein the direct bonding occurs at the dielectric surfaces followed by direct bonding between metal bonding pads, vias, and interconnects of the dies 2102 in an annealing step of the same overall direct bonding operation. One or more extra dummy dies on top of each stack 2104 may be direct bonded to each respective stack 2104 with oxide-oxide direct bonding.

A singulation operation 2110 dices individual stacks 2104 into individual module units 2112, such as individual high bandwidth memory modules.

Figure 22:
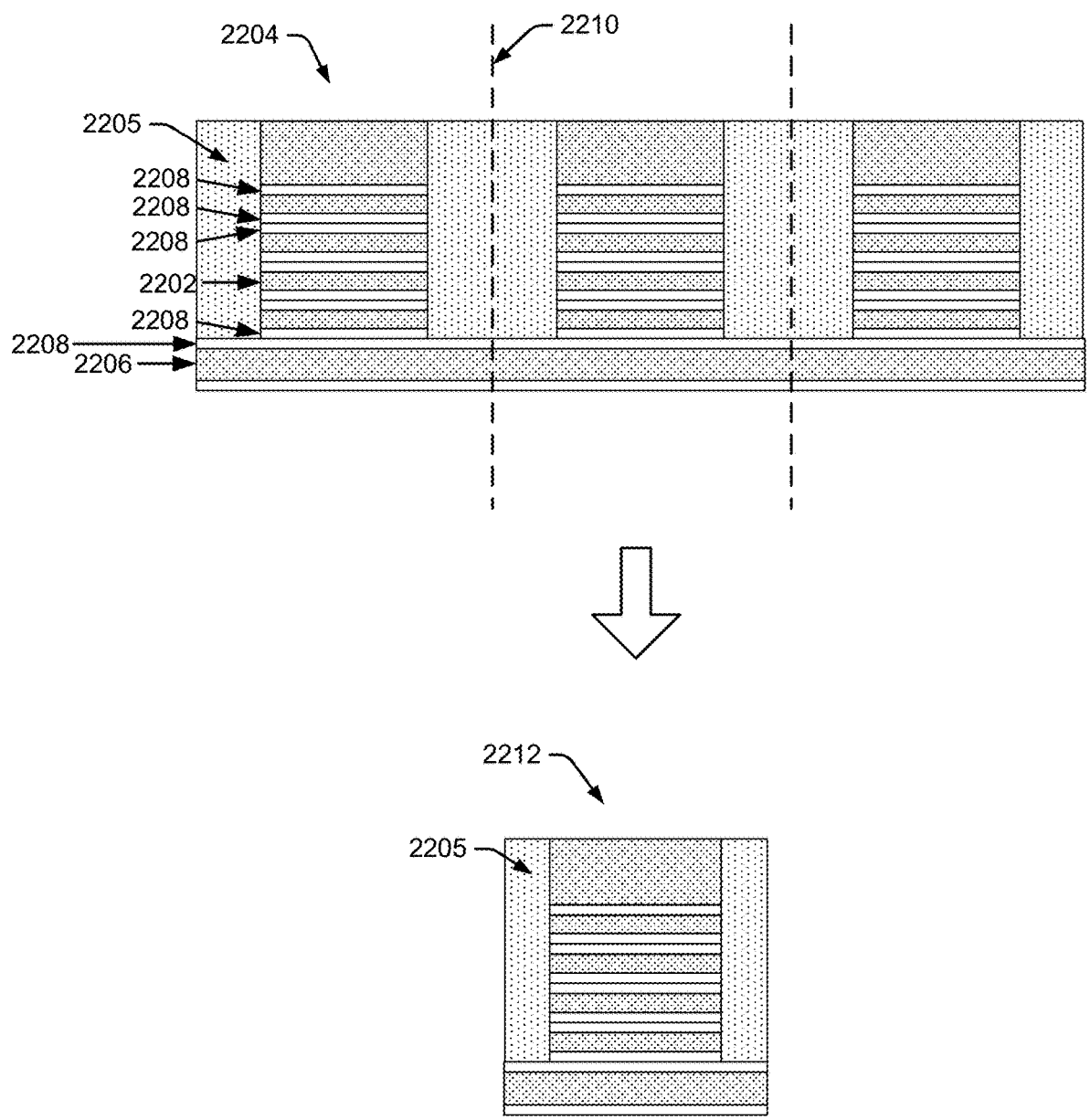
FIG. 22 is another diagram of example structures possible that include features for reducing interior stresses.

FIG. 22 shows thin dies 2202 direct hybrid bonded together into stacks 2204 and encapsulated with a molding material 2205. Each stack 2204 is built on a common wafer substrate 2206, carrier, panel, etc. Direct hybrid bonding layer 2208 consists of extremely thin layers of dielectric 2208 on the dies 2202 and substrate 2206 to enable the direct hybrid bonding. Thin layers 2208 of dielectric and metal (direct hybrid bonding layer 2108) on the dies 2202 and substrate 2206 enable the direct hybrid bonding. The bonding layer 2208 may consist of multiple layers, and/or may consist of a combination of dielectric material(s) and metal (s). The dielectric may consist of multilayer dielectrics including but not limited to diffusion barrier layers and dielectric layers for bonding which consist of Si, O, N, and C. Additionally, layer 2208 may also contain metal materials as conductive pads, wherein the direct bonding occurs at the dielectric surfaces followed by direct bonding between metal bonding pads, vias, and interconnects of the dies 2202 in an annealing step of the same overall direct bonding operation. One or more extra dummy dies on top of each stack 2204 may be direct bonded to each respective stack 2204 with oxide-oxide direct bonding, for example.

A singulation operation 2210 dices individual stacks 2204 into individual module units 2212 that are pre-encapsulated 2205.

Figure 23:
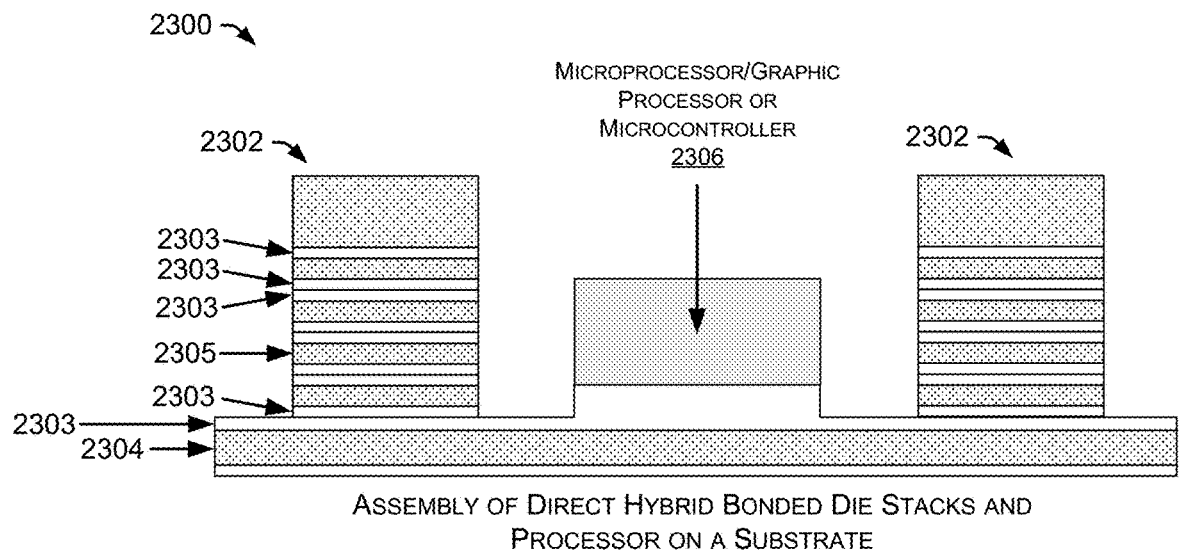
FIG. 23 is a diagram of an example structure with one or more direct bonded die stacks incorporating stress-relief measures, a processor, and optional heat sink.
Figure 23:
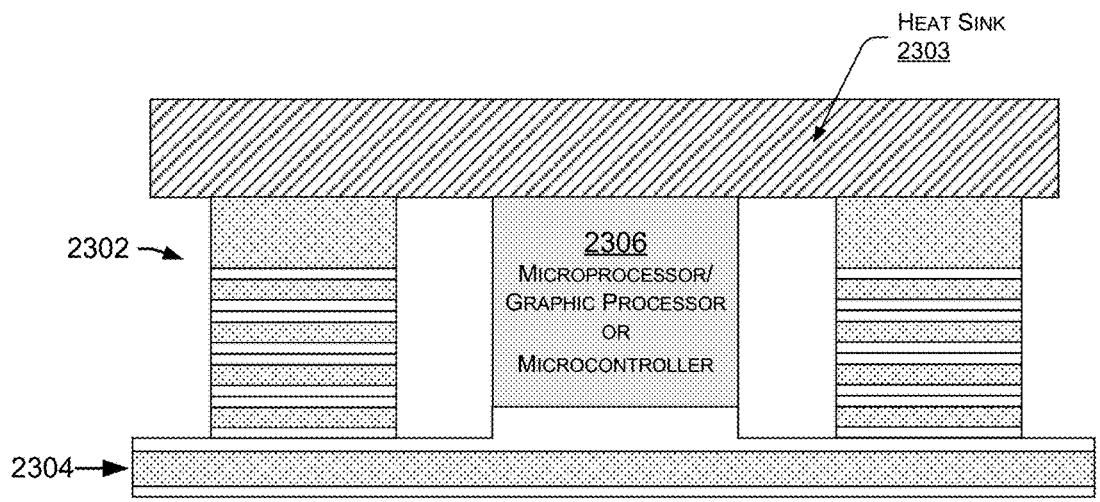

FIG. 23 shows an example module 2300 with one or more direct bonded die stacks 2302 on a substrate 2304 or board, and a microprocessor 2306 and/or graphics processor, or microcontroller, mounted on the same substrate 2304 or board. Each of the one or more direct bonded die stacks 2302 incorporates one of the described stress or warpage-relief measures or stress-warpage prevention devices of FIGS. 2-22. The microprocessor 2306 or other logic unit or processor is communicatively coupled with the one or more direct bonded die stacks 2302. Thin layers 2303 of dielectric and metal (direct hybrid bonding layer 2303) on the dies 2305 and substrate 2304 enable the direct hybrid bonding.

The bonding layer 2303 may consist of multiple layers, and/or may consist of a combination of dielectric material(s) and metal(s). The dielectric may consist of multilayer dielectrics including but not limited to diffusion barrier layers and dielectric layers for bonding which consist of Si, O, N, and C. Additionally, layer 2303 may also contain metal materials as conductive pads, wherein the direct bonding occurs at the dielectric surfaces followed by direct bonding between metal bonding pads, vias, and interconnects of the dies 2305 in an annealing step of the same overall direct bonding operation.

In an implementation, the module 2300 includes at least one heat sink 2308, and in an implementation, the one or more die stacks 2302 and the microprocessor 2306 are in contact with a common heat sink 2308.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. An apparatus comprising:
a substrate; and
a direct bonded die stack formed on the substrate, the direct bonded die stack comprising a plurality of dies including:
a first die comprising a first bonding surface, wherein the first die possesses first physical dimensions and is a top die of the direct bonded die stack;
a second die comprising a second bonding surface, wherein the second die possesses second physical dimensions different than the first physical dimensions; and
an array of cavities on the first bonding surface of the top die,
wherein the first bonding surface of the first die is direct bonded to the second bonding surface of the second die.

2. The apparatus of claim 1, wherein the top first die has a greater vertical thickness than the second die.

3. The apparatus of claim 1, wherein the top die has at least one horizontal dimension greater than a corresponding horizontal dimension of the second die.

4. The apparatus of claim 3, wherein the top die has two horizontal dimensions greater than corresponding horizontal dimensions of the second die.

5. The apparatus of claim 1, further comprising an underfill or molding material on the substrate and surrounding at least a portion of the dies in the direct bonded die stack.

6. The apparatus of claim 1, wherein the top die comprises a dummy die.

7. The apparatus of claim 1, wherein the top die has a surface with a central region in contact with the second die in the direct bonded die stack and a peripheral region with at least a portion of the surface not in contact with the second die in the direct bonded die stack.

8. The apparatus of claim 1, wherein at least one of the dies in the direct bonded die stack comprises a memory die.

9. The apparatus of claim 1, wherein at least one of the dies in the direct bonded die stack has rounded edges.

10. An apparatus comprising:
a substrate; and
a direct bonded die stack formed on the substrate, the direct bonded die stack comprising:
a plurality of dies including:
a first die comprising a first bonding surface, wherein the first die possesses first physical dimensions and is a top die of the direct bonded die stack; and
a second die comprising a second bonding surface, wherein the second die possesses second physical dimensions different than the first physical dimensions,
wherein the first bonding surface of the first die is direct bonded to the second bonding surface of the second die; and
a non-die layer within the direct bonded die stack.

11. The apparatus of claim 10, wherein the non-die layer comprises one of a molding material, an underfill material, an electrical interconnect, an electrical interconnect embedded in a molding material, or an electrical interconnect embedded in an underfill material.

12. The apparatus of claim 11, wherein the molding material, the underfill material, or the electrical interconnect extends at least partially between the top die and the second die in the direct bonded die stack.

13. The apparatus of claim 10, wherein the non-die layer comprises at least one compliant layer in the direct bonded die stack.

14. The apparatus of claim 13, wherein the at least one compliant layer has a Young's modulus of less than 4 GPa.

15. The apparatus of claim 10, wherein the non-die layer comprises one of a titanium nitride-tantalum (TiN/Ta) layer, an aluminum layer, a tantalum layer, or a combination of aluminum and tantalum layers.

16. The apparatus of claim 10, wherein the non-die layer comprises a curved surface.

17. The apparatus of claim 10, further comprising a die support structure contacting at least a portion of the dies in the direct bonded die stack, the non-die layer in contact with the die support structure.

18. The apparatus of claim 10, wherein a functional die in the direct bonded die stack is vertically thinner than the top die.

* * * * *

UNITED STATES PATENT AND TRADEMARK OFFICE
CERTIFICATE OF CORRECTION

PATENT NO. : 11,296,053 B2
APPLICATION NO. : 16/911360
DATED : April 5, 2022
INVENTOR(S) : Cyprian Emeka Uzoh et al.

Page 1 of 1

It is certified that error appears in the above-identified patent and that said Letters Patent is hereby corrected as shown below:

On the Title Page

Column 2, Line 1, under Primary Examiner, delete "Nu" and insert --Vu--.

On Page 2, Column 1, Line 17, under item (56) U.S. Patent Documents, delete "Trickett" and insert --Trickett et al.--.

On Page 2, Column 2, Line 39, under item (56) U.S. Patent Documents, delete "Ku" and insert --Xu--.

In the Drawings

On Sheet 13 of 23, FIG. 13, Reference Number 1302, Line 1, delete "CORNDERS" and insert --CORNERS--.

On Sheet 13 of 23, FIG. 13, Reference Number 1306, Line 1, after "BOND" , delete "THE".

On Sheet 15 of 23, FIG. 15, Line 10, delete "UNDERFIL" and insert --UNDERFILL--.

In the Claims

Column 14, In Claim 2, Line 1, delete "first".

Signed and Sealed this
Twenty-eighth Day of November, 2023

Katherine Kelly Vidal
*Director of the United States Patent and Trademark Office*